(12) United States Patent
Yu et al.

(10) Patent No.: US 9,206,955 B2
(45) Date of Patent: Dec. 8, 2015

(54) OPTICAL LENS, OPTICAL LENS MODULE, AND METHOD FOR FORMING CURVED SURFACE OF OPTICAL LENS

(75) Inventors: Ching-Tan Yu, Hsinchu (TW); Li-Ling Lee, Qionglin Shiang (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1040 days.

(21) Appl. No.: 13/309,939

(22) Filed: Dec. 2, 2011

(65) Prior Publication Data

US 2012/0170281 A1 Jul. 5, 2012

(30) Foreign Application Priority Data

Dec. 29, 2010 (TW) ................................ 99146693 A
Aug. 24, 2011 (TW) .............................. 100130375 A

(51) Int. Cl.
*F21V 5/04* (2006.01)
*G02B 19/00* (2006.01)
(Continued)

(52) U.S. Cl.
CPC .............. *F21V 5/04* (2013.01); *G02B 19/0014* (2013.01); *G02B 19/0061* (2013.01); *F21Y 2101/02* (2013.01); *G02B 27/0012* (2013.01); *H01L 33/58* (2013.01)

(58) Field of Classification Search
CPC .......... F21V 5/04; F21V 5/046; F21V 5/048; F21V 5/08; F21V 7/09; G02B 19/0014; G02B 19/0061; G02B 27/0012; F21Y 2101/02; H01L 33/58
USPC ....................................................... 362/355
See application file for complete search history.

(56) References Cited

U.S. PATENT DOCUMENTS 7,859,614 B2 * 12/2010 Moon ............... G02F 1/133603
349/69
2006/0083000 A1 * 4/2006 Yoon .......................... F21V 5/04
362/311.02

(Continued)

FOREIGN PATENT DOCUMENTS

CN 101527338 A 9/2009
CN 201434331 Y 3/2010

(Continued)

OTHER PUBLICATIONS

Ding et al.: "Freeform LED lens for uniform illumination," Optics Express vol. 16(17), Aug. 2008, 12958-12966.

(Continued)

*Primary Examiner* — Ismael Negron
*Assistant Examiner* — Leah S Macchiarolo
(74) *Attorney, Agent, or Firm* — Maschoff Brennan

(57) ABSTRACT

An optical lens includes a first curved surface and a second curved surface. The first curved surface is for receiving a light ray, and includes a first curve, a second curve, a first symmetrical curve and a second symmetrical curve disposed on a first plane, and a third curve and a fourth curve disposed on a third plane. The second curved surface is opposite to the first curved surface, and includes a fifth curve, a sixth curve, a fifth symmetrical curve and a sixth symmetrical curve disposed on the first plane, and a seventh curve and an eighth curve disposed on the third plane. The first plane is perpendicular to the third plane, and the curvatures of all the curves are controlled by a weight factor, so that the light ray is emitted onto a preset area through the optical lens.

4 Claims, 25 Drawing Sheets

(51) Int. Cl.
 *H01L 33/58* (2010.01)
 *F21Y 101/02* (2006.01)
 *G02B 27/00* (2006.01)

(56) References Cited

U.S. PATENT DOCUMENTS

| | | | |
|---|---|---|---|
| 2007/0115660 A1* | 5/2007 | Lee | G02F 1/133603 362/240 |
| 2007/0159847 A1 | 7/2007 | Li | |
| 2008/0247173 A1 | 10/2008 | Danek et al. | |
| 2008/0279541 A1* | 11/2008 | Montgomery | F21V 5/04 396/62 |
| 2009/0002985 A1 | 1/2009 | Peck et al. | |
| 2009/0225551 A1 | 9/2009 | Chang et al. | |
| 2009/0321767 A1 | 12/2009 | Shih et al. | |
| 2009/0323352 A1 | 12/2009 | Shih et al. | |
| 2010/0002441 A1 | 1/2010 | Ho | |
| 2010/0073928 A1 | 3/2010 | Kim et al. | |
| 2011/0320024 A1* | 12/2011 | Lin | F21V 5/04 700/98 |
| 2014/0104853 A1* | 4/2014 | Lin | G02B 19/0061 362/335 |

FOREIGN PATENT DOCUMENTS

| | | |
|---|---|---|
| CN | 201539815 U | 8/2010 |
| CN | 101545609 B | 9/2010 |
| EP | 1 015 808 B1 | 11/2005 |
| TW | 200636295 A | 10/2006 |
| TW | M345356 A | 11/2008 |
| TW | D127498 A | 2/2009 |
| TW | M390413 U1 | 10/2010 |

OTHER PUBLICATIONS

Chen et al.: "Free-form lenses for high illumination quality light-emitting diode MR16 lamps," Optical Engineering vol. 48(12), Dec. 2009, 123002(1-7).
Parkyn et al.: "LED downlights with non-circular spots," Proc.of SPIE vol. 5941, 2005, 594119(1-12).
Parkyn et al.: "New TIR Lens Applications for Light-Emitting Diodes," Proc. of SPIE vol. 3139, 1997, 135-140.
Ding et al.: "Secondary optical design for LED illumination using freeform lens," Illumination Optics, Proc. of SPIE vol. 7103, 2008, 71030(1-8).
Zhen et al.: "The Optimal Design of TIR Lens for Improving LED Illumination Uniformity and Efficiency," Optical Design and Testing III, Proc. of SPIE vol. 6834, 2007, 68342K(1-8).
Parkyn et al.: "Uniformly illuminating dual-lens system for LED collimation," Nonimaging Optics, Proc. of SPIE vol. 4446, 2002, 232-238.
TW Office Action dated Jun. 10, 2014 as received in Application No. 100130375.

* cited by examiner

OPTICAL LENS, OPTICAL LENS MODULE, AND METHOD FOR FORMING CURVED SURFACE OF OPTICAL LENS

CROSS-REFERENCE TO RELATED APPLICATIONS

This non-provisional application claims priority under 35 U.S.C. §119(a) on Patent Application No(s). 099146693 filed in Taiwan, R.O.C. on Dec. 29, 2010 and Patent Application No. 100130375 filed in Taiwan, R.O.C. on Aug. 24, 2011, the entire contents of which are hereby incorporated by reference.

BACKGROUND

1. Technical Field

The disclosure relates to an optical lens, an optical lens module, and a method for forming a curved surface of an optical lens, and more particularly, to an optical lens, an optical lens module, and a method for forming a curved surface of an optical lens applicable to an illumination device.

2. Related Art

Since people are gradually aware of the energy crisis, countries all over the world successively invest a lot of manpower and money to develop and research green energy resources, so that the development of solar industry and Light-Emitting Diode (LED) industry gets much attention. The LED has the advantages of power saving, low pollution, small in size, collision-resistance, a low calorific value, a fast response and a long service life, so the LED becomes an energy-saving light source in the new generation.

The current LED is not only applied to a display and an indicator, but also is gradually applied to an illumination apparatus such as an electric torch, a street lamp, a table lamp or a projecting lamp. When the LED is applied to the street lamp, the LED needs to meet the requirements of high brightness, low power consumption and a specific illumination range (also referred to as light shape). The local governments set different standards for the illumination light shape generated by the street lamp for the item of specific illumination range. The light shape herein refers to as an irradiation range formed through the irradiation of the light ray emitted from the lamp on the street.

However, the shape and the type of the illumination device designed with the LED as the light source are changed with different illumination light shapes. At present, 90% LEDs in the market have respectively different shapes and types, so that a user may select an appropriate light source specification for application according to different environmental requirements on illumination brightness. However, a lot of manpower and money need to be invested to develop and research the LED light devices with different specifications, which does not conform to economic efficiency of products.

SUMMARY

The disclosure discloses an optical lens, an optical lens module and a method for forming a curved surface of an optical lens to solve the problem of a high research cost.

The optical lens according to the disclosure is applicable to receiving a light ray. In an embodiment, the optical lens includes a first curved surface and a second curved surface. The first curved surface is used for receiving the light ray, and the first curved surface includes a first curve, a second curve, a first symmetrical curve, a second symmetrical curve, a third curve and a fourth curve, in which the first curve, the second curve, the first symmetrical curve, and the second symmetrical curve are disposed on a first plane, and the third curve and the fourth curve are disposed on a third plane. The curvatures of the first curve and the first symmetrical curve are controlled by a first weight factor, the curvatures of the second curve and the second symmetrical curve are controlled by a second weight factor, the curvature of the third curve is controlled by a third weight factor, and the curvature of the fourth curve is controlled by a fourth weight factor. A first cross-section shape of the first curved surface on a second plane is different from a second cross-section shape of the first curved surface on the third plane in shape, and the first plane, the second plane and the third plane are perpendicular to each other.

The second curved surface is opposite to the first curved surface, and the second curved surface includes a fifth curve, a sixth curve, a fifth symmetrical curve, a sixth symmetrical curve, a seventh curve and an eighth curve, in which the fifth curve and the sixth curve are disposed on the first plane, and the seventh curve and the eighth curve are disposed on the third plane. The curvatures of the fifth curve and the fifth symmetrical curve are controlled by a fifth weight factor, the curvatures of the sixth curve and the sixth symmetrical curve are controlled by a sixth weight factor, the curvature of the seventh curve is controlled by a seventh weight factor, and the curvature of the eighth curve is controlled by an eighth weight factor. A third cross-section shape of the second curved surface on the second plane is different from a fourth cross-section shape of the second curved surface on the third plane in shape. The light ray may be emitted onto a preset area through the first curved surface and the second curved surface.

In another embodiment of the optical lens according to the disclosure, the optical lens includes a first curved surface and a second curved surface. The first curved surface is used for receiving a light ray, and the first curved surface includes a first curve, a first symmetrical curve and a second curve. The first curve and the first symmetrical curve are disposed on a first plane, and the first curve is symmetrical to the first symmetrical curve by taking a first direction axis as a symmetrical axis. The first curve conforms to a first curve equation $y=-0.011x^6-0.0004x^5+0.0771x^4+0.0025x^3-0.2892x^2-0.0024x+2.7968$. The second curve is disposed on a third plane, and the second curve conforms to a second curve equation $z=0.0085x^6-0.0095x^5-0.1592x^4-0.0469x^3+0.3032x^2+0.8129x+3.1422$. The first plane is perpendicular to the third plane. When a value of x is the same for the first curve and the second curve, a third curve is obtained through a first curve fitting equation $$a = \frac{y}{(1+2\times(W_{y-z}^2-0.5))},$$

and when a value of x is the same for the first symmetrical curve and the second curve, a fourth curve is obtained through a second curve fitting equation $$a' = \frac{y}{(1+2\times((-W_{y-z})^2-0.5))}.$$

The first curve, the second curve, the multiple third curves, and the multiple fourth curves form the first curved surface, in which x is a parameter on the first direction axis, y is a parameter on a second direction axis, and z is a parameter on a third direction axis. The first plane is a plane formed by the first direction axis and the second direction axis, and the third plane is a plane formed by the first direction axis and the third direction axis. The first direction axis, the second direction axis, and the third direction axis intersect at an origin, $W_{y-z}$ is a first weight factor of each of the third curves, and $-W_{y-z}$ is a second weight factor of each of the fourth curves. A distance a is a distance from an intersection point of a tangent of any point on each of the third curves and the second direction axis to the origin, and a distance a' is another distance from an intersection point of a tangent of any point on each of the fourth curves and the second direction axis to the origin.

The second curved surface is opposite to the first curved surface, and the second curved surface includes a fifth curve, a fifth symmetrical curve and a sixth curve. The fifth curve and the fifth symmetrical curve are disposed on the first plane. The fifth curve is symmetrical to the fifth symmetrical curve by taking the first direction axis as a symmetrical axis, and the fifth curve conforms to a third curve equation $y=-0.001x^6+0.0029x^4-0.0002x^3-0.1298x^2-0.0004x+7.0511$. The sixth curve is disposed on the third plane, and the sixth curve conforms to a fourth curve equation $z=0.0003x^4-0.0002x^3-0.0305x^2+0.005x+8.5870$. When a value of x is the same for the fifth curve and the sixth curve, a seventh curve is obtained through a third curve fitting equation $$b = \frac{y}{(1 + 2 \times (W'^2_{y-z} - 0.5))},$$

and when a value of x is the same for the fifth symmetrical curve and the sixth curve, an eighth curve is obtained through a fourth curve fitting equation $$b' = \frac{y}{(1 + 2 \times ((-W'_{y-z})^2 - 0.5))}.$$

The fifth curve, the sixth curve, the multiple seventh curves, and the multiple eighth curves form the second curved surface, in which $W'_{y-z}$ is a third weight factor of each of the seventh curves, and $-W'_{y-z}$ is a fourth weight factor of each of the eighth curves. A distance b is a distance from an intersection point of a tangent of any point on each of the seventh curves and the second direction axis to the origin, and a distance b' is a distance is another distance from an intersection point of a tangent of any point on each of the eighth curves and the second direction axis has to the origin.

The optical lens module according to the disclosure is applicable to a lamp, in which the lamp has multiple light sources. In an embodiment, the optical lens module includes a substrate and multiple optical lenses. Each of the optical lenses is disposed on the substrate, and corresponds to each of the light sources. Each of the optical lenses includes a first curved surface and a second curved surface. The first curved surface is used for receiving a light ray, and includes a first curve, a second curve, a first symmetrical curve, a second symmetrical curve, a third curve and a fourth curve, in which the first curve and the second curve are disposed on a first plane, and the third curve and the fourth curve are disposed on a third plane. The curvatures of the first curve and the first symmetrical curve are controlled by a first weight factor, the curvatures of the second curve and the second symmetrical curve are controlled by a second weight factor, the curvature of the third curve is controlled by a third weight factor, and the curvature of the fourth curve is controlled by a fourth weight factor. A first cross-section shape of the first curved surface on a second plane is different from a second cross-section shape of the first curved surface on the third plane in shape. The first plane, the second plane and the third plane are perpendicular to each other.

The second curve is opposite to the first curved surface, and the second curve includes a fifth curve, a sixth curve, a fifth symmetrical curve, a sixth symmetrical curve, a seventh curve and an eighth curve. The fifth curve and the sixth curve are disposed on the first plane, and the seventh curve and the eighth curve are disposed on the third plane. The curvatures of the fifth curve and the fifth symmetrical curve are controlled by a fifth weight factor, the curvatures of the sixth curve and the sixth symmetrical curve are controlled by a sixth weight factor, the curvature of the seventh curve is controlled by a seventh weight factor, and the curvature of the eighth curve is controlled by an eighth weight factor. A third cross-section shape of the second curved surface on the second plane is different from a fourth cross-section shape of the second curved surface on the third plane in shape. The light ray may be emitted onto a preset area through the first curved surface and the second curved surface.

In another embodiment of the optical lens module according to the disclosure, the optical lens module is applicable to a lamp having multiple light sources, and the optical lens module includes a substrate and multiple optical lenses. The multiple optical lenses are disposed on the substrate, and each of the optical lenses corresponds to each of the light source. Each of the optical lenses includes a first curved surface and a second curved surface. The first curved surface is used for receiving a light ray, and the first curved surface includes a first curve, a first symmetrical curve and a second curve. The first curve and the first symmetrical curve are disposed on a first plane, and the first curve is symmetrical to the first symmetrical curve by taking a first direction axis as a symmetrical axis. The first curve conforms to a first curve equation $y=-0.011x^6-0.0004x^5+0.0771x^4+0.0025x^3-0.2892x^2-0.0024x+2.7968$. The second curve is disposed on a third plane, and conforms to a second curve equation: $z=0.0085x^6-0.0095x^5-0.1592x^4-0.0469x^3+0.3032x^2+0.8129x+3.1422$. The first plane is perpendicular to the third plane. When a value of x is the same for the first curve and the second curve, a third curve is obtained through a first curve fitting equation $$a = \frac{y}{(1 + 2 \times (W^2_{y-z} - 0.5))},$$

and when a value of x is the same for the first symmetrical curve and the second curve, a fourth curve is obtained through a second curve fitting equation $$a' = \frac{y}{(1 + 2 \times ((-W_{y-z})^2 - 0.5))}.$$

The first curve, the first symmetrical curve, the second curve, multiple third curves, and multiple fourth curves form the first curved surface, in which x is a parameter on the first direction axis, y is a parameter on a second direction axis, and z is a parameter on a third direction axis. The first plane is a plane formed by the first direction axis and the second direction axis, and the third plane is a plane formed by the first direction axis and the third direction axis. The first direction axis, the second direction axis, and the third direction axis intersect at an origin. $W_{y-z}$ is a first weight factor of each of the third curves, and $-W_{y-z}$ is a second weight factor of each of the fourth curves. A distance a is a distance from an intersection point of a tangent of any point on each of the third curves and the second direction axis to the origin, and a distance a' is another distance from an intersection point of a tangent of any point on each of the fourth curves and the second direction axis to the origin.

The second curved surface is opposite to the first curved surface, and the second curved surface includes a fifth curve, a fifth symmetrical curve and a sixth curve. The fifth curve and the fifth symmetrical curve are disposed on the first plane. The fifth curve is symmetrical to the fifth symmetrical curve by taking the first direction axis as a symmetrical axis, and the fifth curve conforms to a third curve equation $y=-0.001x^6+0.0029x^4-0.0002x^3-0.1298x^2-0.0004x+7.0511$. The sixth curve is disposed on the third plane, and the sixth curve conforms to a fourth curve equation $z=0.0003x^4-0.0002x^3-0.0305x^2+0.005x+8.5870$. When a value of x is the same for the fifth curve and the sixth curve, a seventh curve is obtained through a third curve fitting equation $$b = \frac{y}{(1 + 2 \times (W'^2_{y-z} - 0.5))},$$

and when a value of x is the same for the fifth symmetrical curve and the sixth curve, an eighth curve is obtained through a fourth curve fitting equation $$b' = \frac{y}{(1 + 2 \times ((-W'_{y-z})^2 - 0.5))}.$$

The fifth curve, the fifth symmetrical curve, the sixth curve, multiple seventh curves, and multiple eighth curves form the second curved surface, in which $W'_{y-z}$ is a third weight factor of each of the seventh curves, and $-W'_{y-z}$ is a fourth weight factor of each of the eighth curves. A distance b is a distance from an intersection point of a tangent of any point on each of the seventh curves and the second direction axis to the origin, and a distance b' is another distance from an intersection point of a tangent of any point on each of the eighth curves and the second direction axis to the origin.

According to an embodiment of the method for forming the curved surface of the optical lens of the disclosure, the method includes receiving an origin parameter, a first endpoint parameter, a second endpoint parameter, a third endpoint parameter, and two first control point parameters, in which the origin parameter is an intersection point of a first direction axis, a second direction axis, and a third direction axis, the first endpoint parameter and the second endpoint parameter are disposed on the first direction axis, the third endpoint parameter is disposed on the second direction axis, each of the first control point parameters is disposed on a first plane, the first plane is a plane formed by the first direction axis and the second direction axis, and the first direction axis, the second direction axis and the third direction axis are perpendicular to one another; and obtaining a first curve and a second curve by using a first weight factor and a second weight factor, in which the first curve and the second curve are disposed on the first plane.

Then, the first plane obtains a third symmetrical point, a first symmetrical curve and a second symmetrical curve by taking the first direction axis as a symmetrical axis, in which the third symmetrical point is symmetrical to the third endpoint parameter, the first symmetrical curve is symmetrical to the first curve, the second symmetrical curve is symmetrical to the second curve, and a third plane is a plane formed by the second direction axis and the third direction axis; and a fourth endpoint parameter and two second control point parameters are received, in which the fourth endpoint parameter is disposed on the third direction axis, and each of the second control point parameters is disposed on the third plane.

Afterwards, a third curve and a fourth curve are obtained by using a third weight factor and a fourth weight factor, in which the third curve and the fourth curve are disposed on the third plane, and the first plane is perpendicular to the third plane; and the first curve, the second curve, the first symmetrical curve, the second symmetrical curve, the third curve and the fourth curve are enabled to form a first curved surface by using a Surface Fitting manner.

According to another embodiment of the method for forming the curved surface of the optical lens of the disclosure, the method includes drawing a first curve on a first plane according to a first curve equation $y=-0.011x^6-0.0004x^5+0.0771x^4+0.0025x^3-0.2892x^2-0.0024x+2.7968$, in which x is a parameter on a first direction axis, y is a parameter on a second direction axis, and the first plane is a plane formed by the first direction axis and the second direction axis; obtaining a first symmetrical curve on the first plane by taking the first direction axis as a symmetrical axis; drawing a second curve on a third plane according to a second curve equation $z=0.0085x^6-0.0095x^5-0.1592x^4-0.0469x^3+0.3032x^2+0.8129x+3.1422$, in which z is a parameter on a third direction axis, the third plane is a plane formed by the first direction axis and the third direction axis, the first plane is perpendicular to the third plane, and the first direction axis, the second direction axis and the third direction axis intersect at an origin.

The method further includes fitting a third curve when a value of x is the same for the first curve and the second curve according to a first curve fitting equation $$a = \frac{y}{(1 + 2 \times (W^2_{y-z} - 0.5))},$$

in which $W_{y-z}$ is a first weight factor of each of the third curves, and a distance a is a distance from an intersection point of a tangent of any point on each of the third curves and the second direction axis to the origin; fitting a fourth curve when a value of x is the same for the first symmetrical curve and the second curve according to a second curve equation $$a' = \frac{y}{(1 + 2 \times ((-W_{y-z})^2 - 0.5))},$$

in which $-W_{y-z}$ is a second weight factor of each of the fourth curves, and a distance a' is another distance from an intersection point of a tangent of any point on each of the fourth curves and the second direction axis has to the origin; and the first curve, the first symmetrical curve, the second curve, the third curves and the fourth curves are enabled to form a first curved surface by using a curved surface fitting equation.

According to the method for forming the curved surface of the optical lens of the disclosure, an optical lens with different light shapes may be designed. The optical lens with different light shapes used as a minimum unit may be assembled into an optical lens module required by the user through a permutation and combination manner to reduce a research cost of various lamps.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Figure 1:
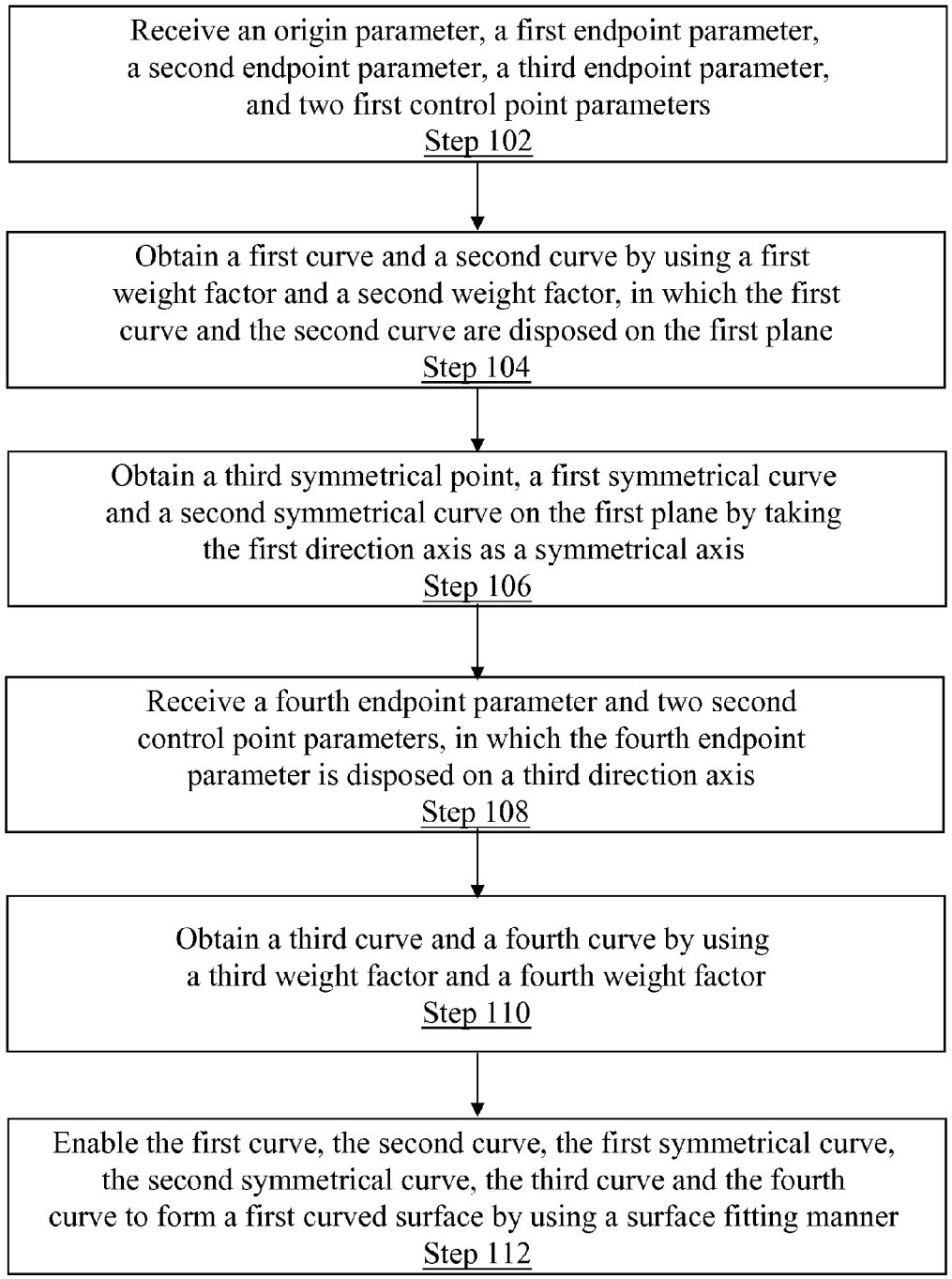
FIG. 1 is a schematic flow chart of an embodiment of a method for forming a curved surface of an optical lens according to the disclosure.

FIG. 1 is a schematic flow chart of an embodiment of a method for forming a curved surface of an optical lens according to the disclosure. Referring to FIG. 1, in this embodiment, the method for forming the curved surface of the optical lens includes the following steps.

In Step 102, an origin parameter, a first endpoint parameter, a second endpoint parameter, a third endpoint parameter, and two first control point parameters are received, in which the origin parameter is an intersection point of a first direction axis, a second direction axis, and a third direction axis, the first endpoint parameter and the second endpoint parameter are disposed on the first direction axis, the third endpoint parameter is disposed on the second direction axis, each of the first control points parameter is disposed on a first plane, the first plane is a plane formed by the first direction axis and the second direction axis, and the first direction axis, the second direction axis and the third direction axis are perpendicular to one another.

In Step 104, a first curve and a second curve are obtained by using a first weight factor and a second weight factor, in which the first curve and the second curve are disposed on the first plane.

In Step 106, a third symmetrical point, a first symmetrical curve and a second symmetrical curve are obtained on the first plane by using the first direction axis as a symmetrical axis, in which the third symmetrical point is symmetrical to the third endpoint parameter, the first symmetrical curve is symmetrical to the first curve, and the second symmetrical curve is symmetrical to the second curve.

In Step 108, a fourth endpoint parameter and two second control point parameters are received, in which the fourth endpoint parameter is disposed on the third direction axis, each of the second control points parameter is disposed on a third plane, and the third plane is a plane formed by the second direction axis and the third direction axis.

In Step 110, a third curve and a fourth curve are obtained by using a third weight factor and a fourth weight factor, in which the third curve and the fourth curve are disposed on the third plane, and the first plane is perpendicular to the third plane.

In Step 112, the first curve, the second curve, the first symmetrical curve, the second symmetrical curve, the third curve and the fourth curve are enabled to form a first curved surface by using a surface fitting manner.

Figure 2:
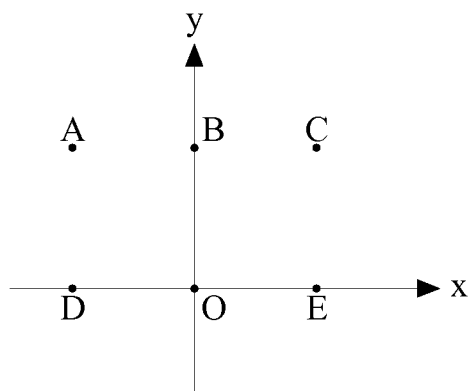
FIG. 2 is a schematic distribution view of an origin parameter, a first endpoint parameter, a second endpoint parameter, a third endpoint parameter and two first control point parameters according to Step 102 in FIG. 1 on a first plane.

FIG. 2 is a schematic distribution view of an origin parameter, a first endpoint parameter, a second endpoint parameter, a third endpoint parameter and two first control point parameters according to Step 102 in FIG. 1 on a first plane. Referring to FIG. 1 and FIG. 2, in this embodiment, the first direction axis may be x axis, but is not limited to the above-mentioned axis, the second direction axis may be y axis, but is not limited to the above-mentioned axis, the third direction axis may be z axis, but is not limited to the above-mentioned axis, the first plane may be x-y plane, but is not limited to the above-mentioned axis, the second plane may be x-z plane, but is not limited to the above-mentioned axis, and the third plane may be y-z plane, but is not limited to the above-mentioned axis. The setting of the first direction axis, the second direction axis, the third direction axis, the first plane, the second plane and the third plane may be adjusted according to the actual requirements.

A coordinate of the origin parameter O described in Step 102 may be (x, y, z)=(0, 0, 0), but is not limited to the above-mentioned coordinate. A coordinate of the first endpoint parameter D may be (x, y, z)=(−1, 0, 0), but is not limited to the above-mentioned coordinate, a coordinate of the second endpoint parameter E may be (x, y, z)=(1, 0, 0), but is not limited to the above-mentioned coordinate, and a coordinate of the third endpoint parameter B may be (x, y, z)=(0, 1, 0), but is not limited to the above-mentioned coordinate. A coordinate of the first control point parameter A may be (x, y, z)=(−1, 1, 0), but is not limited to the above-mentioned coordinate, and a coordinate of the first control point parameter C may be (x, y, z)=(1, 1, 0), but is not limited to the above-mentioned coordinate. That is to say, the formulation of the actual origin parameter O, the first endpoint parameter D, the second endpoint parameter E, the third endpoint parameter B, the first control point parameter A, and the first control point parameter C may be adjusted according to the actual requirements.

In the Step 104, the curvatures of the first curve 202 and the second curve 104 are controlled through the first weight factor and the second weight factor. The curvature of the first curve 202 (referring to FIG. 4) is adjusted through the first weight factor in the following for description, and the curvatures of the second curve 204 (referring to FIG. 4), the third curve 206 (referring to FIG. 6), and the fourth curve 208 (referring to FIG. 6) may be adjusted in the same way, which is not described in detail again.

Figure 3:
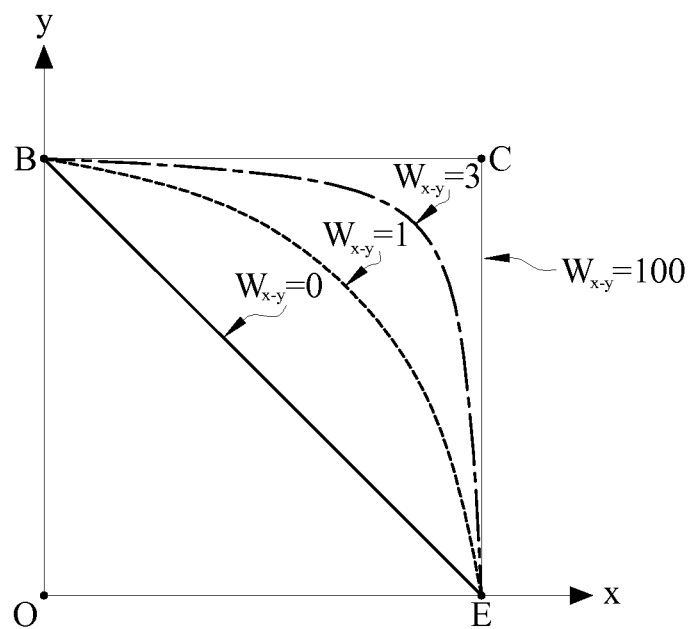
FIG. 3 is a schematic view of a relation between a first curve and a first weight factor when a first direction axis is greater than 0 according to the disclosure.

FIG. 3 is a schematic view of a relation between a first curve and a first weight factor when a first direction axis is greater than 0 according to the disclosure. Referring to FIG. 3, it can be known from FIG. 3 that, when a value of the first weight factor $W_{x-y}$ in a positive x axis direction (x>0) is 0, the first curve 202 is a straight line (a bold line in FIG. 3) connecting to the second endpoint parameter E and the third endpoint parameter B. When a value of the first weight factor $W_{x-y}$ in the positive x axis direction (x>0) is 100, the first curve 202 is two line segments (fine lines in FIG. 3) connecting to the second endpoint parameter E and the third endpoint parameter B through the first control point parameter C. When a value of the first weight factor $W_{x-y}$ in the positive x axis direction (x>0) is 1, the first curve 202 is an imaginary line in FIG. 3. When a value of the first weight factor $W_{x-y}$ in the positive x axis direction (x>0) is 3, the first curve 202 is a central line in FIG. 3.

In other words, the value of the first weight factor $W_{x-y}$ ranges between 0 to 100 in the positive x axis direction (x>0). When the value of the first weight factor $W_{x-y}$ in a positive x axis direction (x>0) is more close to 0, the first curve 202 is more close to the bold line in FIG. 3, and when the value of the first weight factor $W_{x-y}$ in a positive x axis direction (x>0) is more close to 100, the first curve 202 is more close to the fine line in FIG. 3. However, this embodiment is not intended to limit the disclosure, and may be adjusted according to actual requirements of the user.

Results of the second curve 204 (referring to FIG. 4), the third curve 206 (referring to FIG. 7) and the fourth curve 208 (referring to FIG. 7) are controlled through a second weight factor $-W_{x-y}$ in a negative x axis direction (x<0), a third weight factor $W_{y-z}$ in a positive y axis direction (y>0), and a fourth weight factor $-W_{y-z}$ in a negative y axis direction (y<0).

Figure 4:
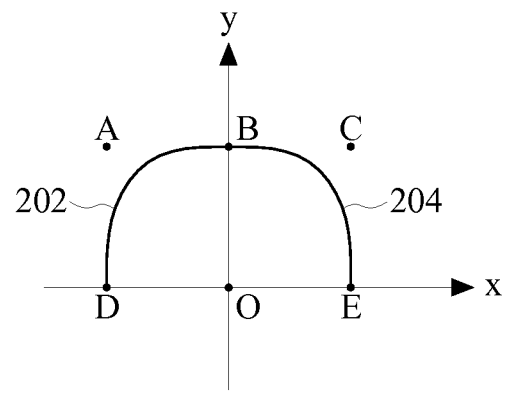
FIG. 4 is a schematic view of an embodiment of a first plane after the execution of Step 104 according to the disclosure.

FIG. 4 is a schematic view of an embodiment of a first plane after the execution of Step 104 according to the disclosure. Referring to FIG. 4, the first curve 202 and the second curve 204 on the first plane (x-y plane) may be obtained after curve fitting of the first weight factor $W_{x-y}$ in the positive x axis direction (x>0) and the second weight factor $-W_{x-y}$ in the negative x axis direction (x<0). It should be noted that, the first weight factor $W_{x-y}$ in the positive x axis direction (x>0) is not necessary the same as the second weight factor $-W_{x-y}$ in the negative x axis direction (x<0), which may be adjusted according to the actual requirements.

Figure 5:
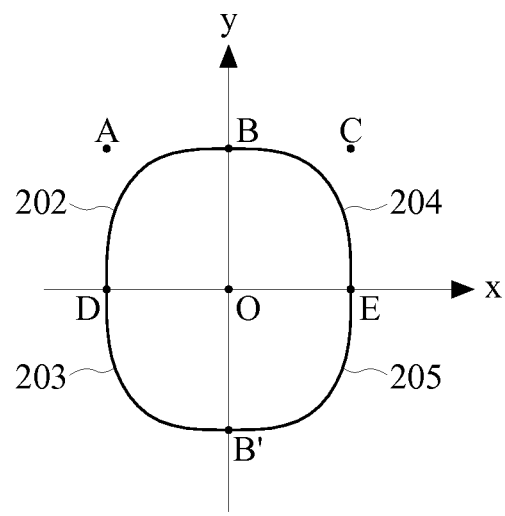
FIG. 5 is a schematic view of an embodiment of a first plane after the execution of Step 106 according to the disclosure.

FIG. 5 is a schematic view of an embodiment of a first plane after the execution of Step 106 according to the disclosure. Referring to FIG. 5, in this embodiment, a coordinate of the third symmetrical point B' as described in Step 106 may be (x, y, z)=(0, −1, 0), but is not limited to the above-mentioned coordinate, and the first symmetrical curve 203 and the second symmetrical curve 205 are respectively symmetrical to the first curve 202 and the second curve 204 by taking the first direction axis (x axis) as a symmetrical axis.

Figure 6:
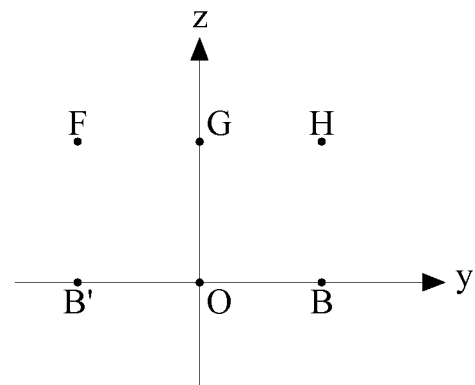
FIG. 6 is a schematic view of an embodiment of a third plane after the execution of Step 108 according to the disclosure.
Figure 7:
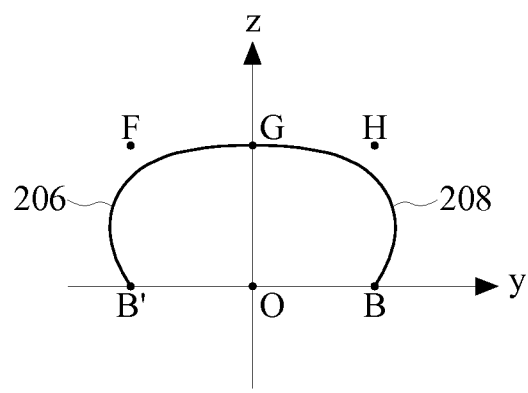
FIG. 7 is a schematic view of an embodiment of a third plane after the execution of Step 110 according to the disclosure.

FIG. 6 is a schematic view of an embodiment of a third plane after the execution of Step 108 according to the disclosure. Referring to FIG. 6, a coordinate of the fourth endpoint parameter G described in Step 108 may be (x, y, z)=(0, 0, 1), but is not limited to the above-mentioned coordinate. A coordinate of a second control point parameter F may be (x, y, z)=(0, −1, 1), but is not limited to the above-mentioned coordinate, and a coordinate of a first control point parameter H may be (x, y, z)=(0, 1, 1), but is not limited to the above-mentioned coordinate. That is to say, the formulation of the actual fourth endpoint parameter G, the second control point parameter F and the second control point parameter H may be adjusted according to the actual requirements. Afterwards, Step 110 is performed, a third curve 206 and a fourth curve 208 may be obtained after curve fitting of a third weight factor $W_{y-z}$ in the positive y axis direction (y>0) and a fourth weight factor $-W_{y-z}$ in the negative y axis direction (y<0) through the third weight factor and the fourth weight factor (referring to FIG. 7, FIG. 7 is a schematic view of an embodiment of a third plane after the execution of Step 110 according to the disclosure).

Figure 8:
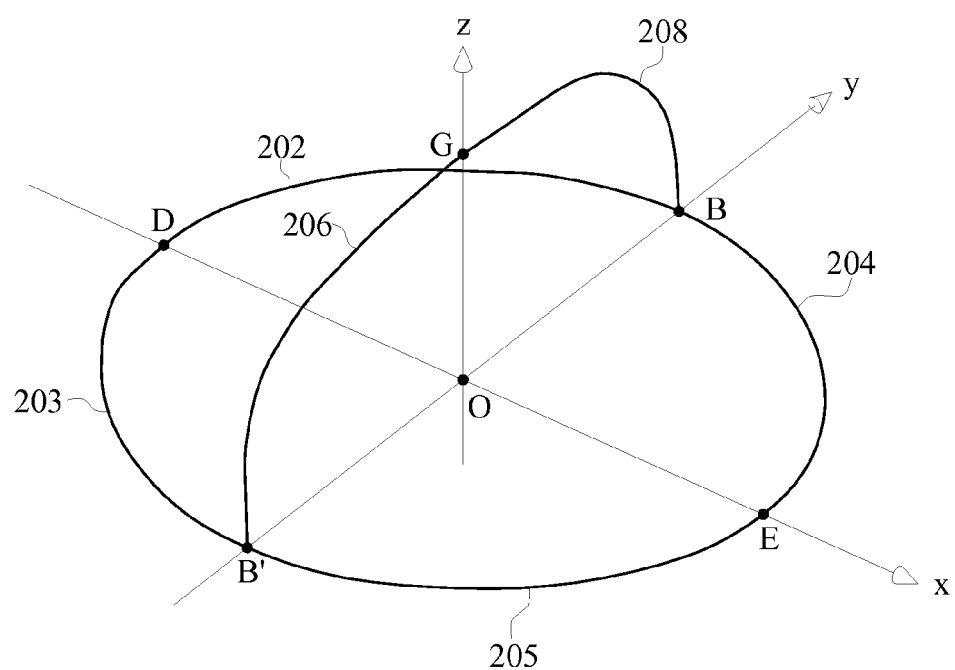
FIG. 8 is a schematic perspective view of an embodiment after the execution of Step 110 according to the disclosure.

FIG. 8 is a schematic perspective view of an embodiment after the execution of Step 110 according to the disclosure. Referring to FIG. 8, it can be seen from FIG. 8 that, a first curve 202, a second curve 204, a first symmetrical curve 203, a second symmetrical curve 205, a third curve 206 and a fourth curve 208 may be obtained after the execution of Step 110. Afterwards, a first curved surface (not drawn) is obtained through a surface fitting manner of the first curve 202, the second curve 204, the first symmetrical curve 203, the second symmetrical curve 205, the third curve 206 and the fourth curve 208.

Through the above-mentioned method, various optical lenses with different specification requirements may be designed. An optical lens required by a street lamp is taken as an example in the following for description, but this embodiment is not intended to limit the disclosure.

Figure 9A:
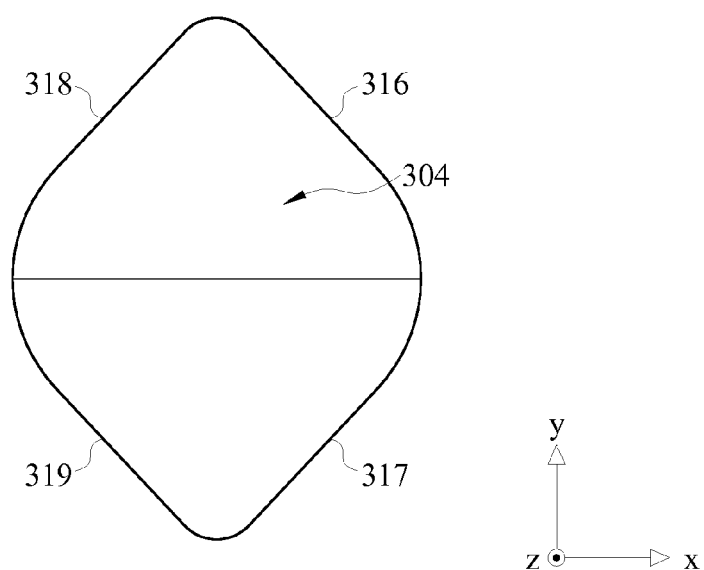
FIG. 9A is a schematic structural top view of an embodiment of an optical lens according to the disclosure.
Figure 9B:
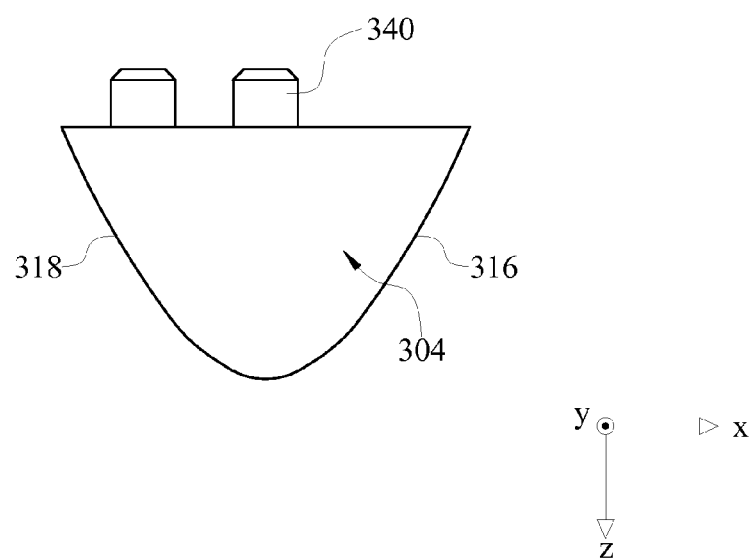
FIG. 9B is a schematic structural side view of an embodiment of an optical lens according to the disclosure.
Figure 9C:
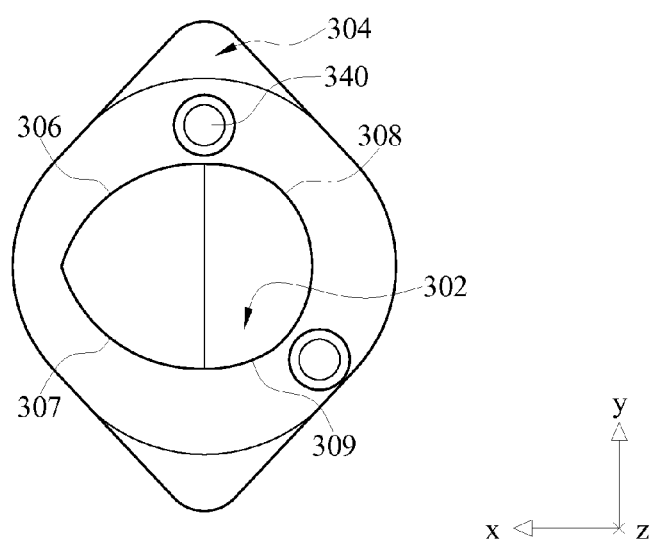
FIG. 9C is a schematic structural bottom view of an embodiment of an optical lens according to the disclosure.

FIG. 9A, FIG. 9B and FIG. 9C are respectively schematic structure top, side, and bottom views of an embodiment of an optical lens according to the disclosure. Referring to FIG. 9A, FIG. 9B and FIG. 9C, an optical lens 300 includes a first curved surface 302 and a second curved surface 304. The first curved surface 302 includes a first curve 306, a first symmetrical curve 307, a second curve 308, a second symmetrical curve 309, a third curve (not shown) and a fourth curve (not shown), in which the first curve 306, the first symmetrical curve 307, the second curve 308, and the second symmetrical curve 309 are disposed on a first plane (x-y plane), the third curve and the fourth curve are disposed on a third plane (y-z plane), the curvatures of the first curve 306 and the first symmetrical curve 307 are controlled by a first weight factor $W_{x-y}$, the curvatures of the second curve 308 and the second symmetrical curve 309 are controlled by a second weight factor $-W_{x-y}$, the curvature of the third curve is controlled by a third weight factor $W_{y-z}$, and the curvature of the fourth curve is controlled by a fourth weight factor $-W_{y-z}$.

The second curved surface 304 includes a fifth curve 316, a fifth symmetrical curve 317, a sixth curve 318, a sixth symmetrical curve 319, a seventh curve (not shown) and an eighth curve (not shown), in which the fifth curve 316, the fifth symmetrical curve 317, the sixth curve 318, and the sixth symmetrical curve 319 are disposed on the first plane (x-y plane), and the seventh curve (not shown) and the eighth curve (not shown) are disposed on the third plane (y-z plane). The curvatures of the fifth curve 316 and the fifth symmetrical curve 317 are controlled by a fifth weight factor $W'_{x-y}$, the curvatures of the sixth curve 318 and the sixth symmetrical curve 319 are controlled by a sixth weight factor $-W'_{x-y}$, the curvature of the seventh curve (not shown) is controlled by a seventh weight factor $W'_{y-z}$, and the curvature of the eighth curve (not shown) is controlled by an eighth weight factor $-W'_{y-z}$.

In this embodiment, a first cross-section shape of the first curved surface 302 on the second plane (y-z plane) is different from a second cross-section shape of the first curved surface 302 on the third plane (x-z plane) in shape. A third cross-section shape of the second curved surface 304 on the second plane (y-z plane) is different from a fourth cross-section shape of the second curved surface 304 on the third plane (x-z plane) in shape. The first plane (x-y plane), the second plane (y-z plane) and the third plane (x-z plane) are perpendicular to one another.

In this embodiment, the first curved surface 302 and the second curved surface 304 may respectively satisfy condition expressions (1) and (2) in the following:

$$0 \leq W_{x-y} \leq 1 \quad (1)$$

$$0 \leq W'_{x-y} \leq 1 \quad (2)$$

in which, $W_{x-y}$ is the first weight factor of the first curved surface 302 in the first plane (x-y plane) in the positive x axis direction (x>0), and $W'_{x-y}$ is the fifth weight factor of the second curved surface 304 in the first plane (x-y plane) in the positive x axis direction (x>0).

Figure 10A:
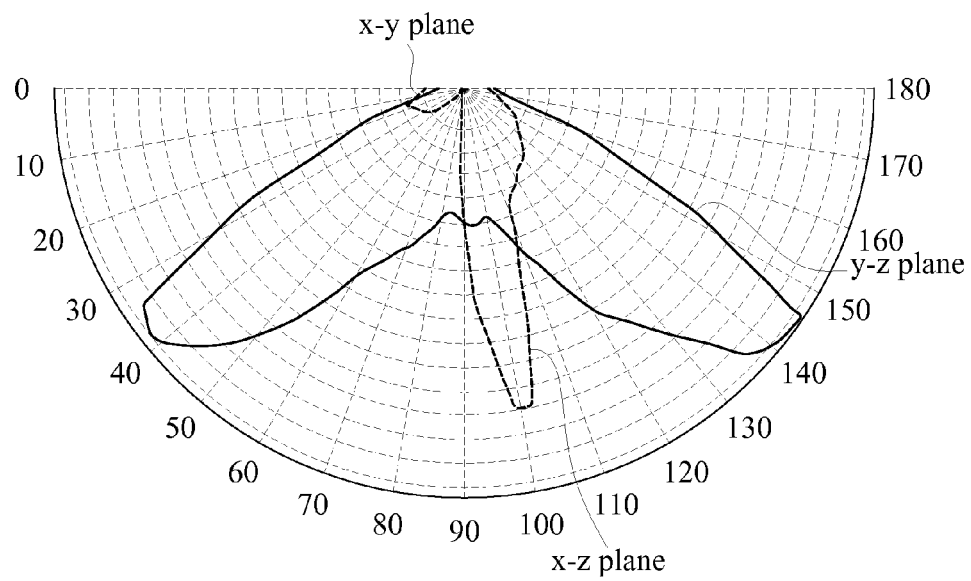
FIG. 10A is a schematic view of a light distribution curve of the optical lens when $W_{x-y}=0.53$ according to the disclosure.
Figure 10B:
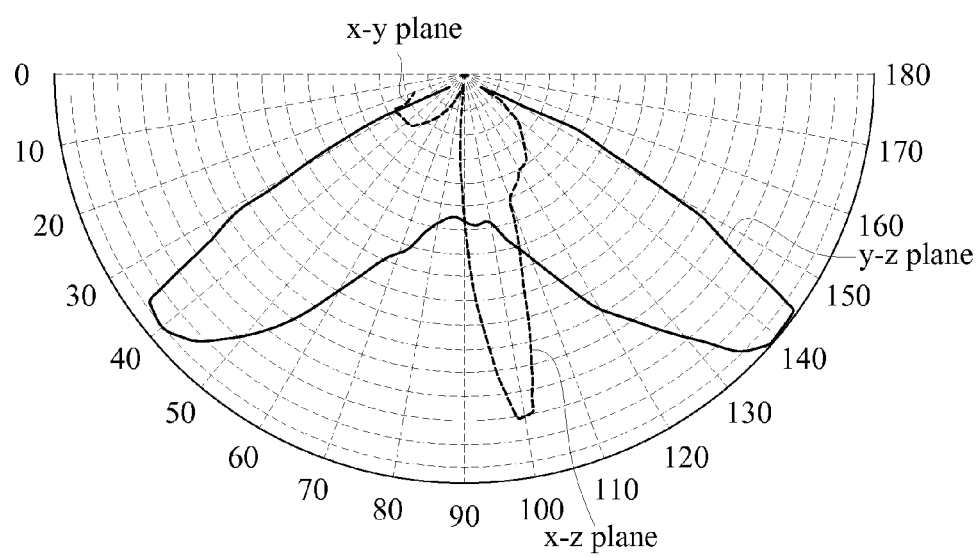
FIG. 10B is a schematic view of a light distribution curve of the optical lens when $W_{x-y}=1.0$ according to the disclosure.
Figure 10C:
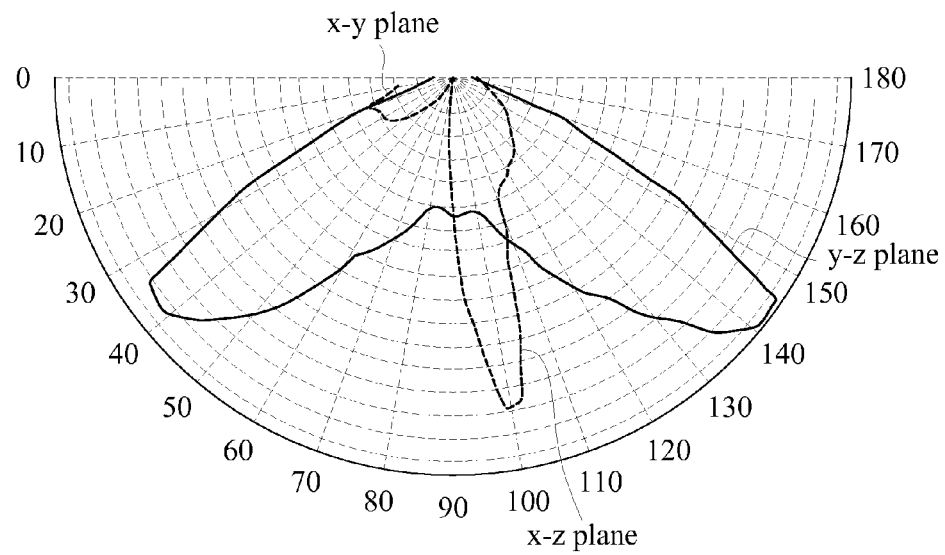
FIG. 10C is a schematic view of a light distribution curve of the optical lens when $W_{x-y}=1.4$ according to the disclosure.

FIG. 10A to FIG. 10C are respectively schematic views of light distribution curves of an optical lens when $W_{x-y}=0.6$, 1.0, and 1.4 according to the disclosure. Referring to FIG. 10A to FIG. 10C, when the optical lens 300 conforms to the above condition expression (1), after the light ray passes through the optical lens 300, an asymmetrical light shape may be generated on the first plane (x-y plane). When the asymmetrical light shape is applied to a street lamp design, the light ray which casts onto an area not requiring illumination beside the street may be conducted onto the street. Therefore, the above-mentioned design increases the utilization of the light ray, reduces unnecessary light pollution, and improves optical efficiency of the street lamp.

Figure 9D:
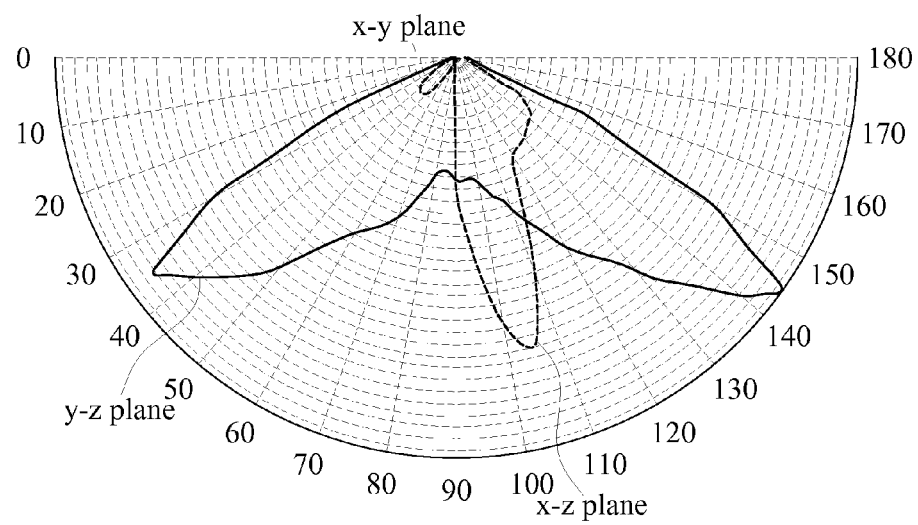
FIG. 9D is a schematic view of a light distribution curve of an optical lens when $W'_{x-y}=0.53$ according to the disclosure.
Figure 11A:
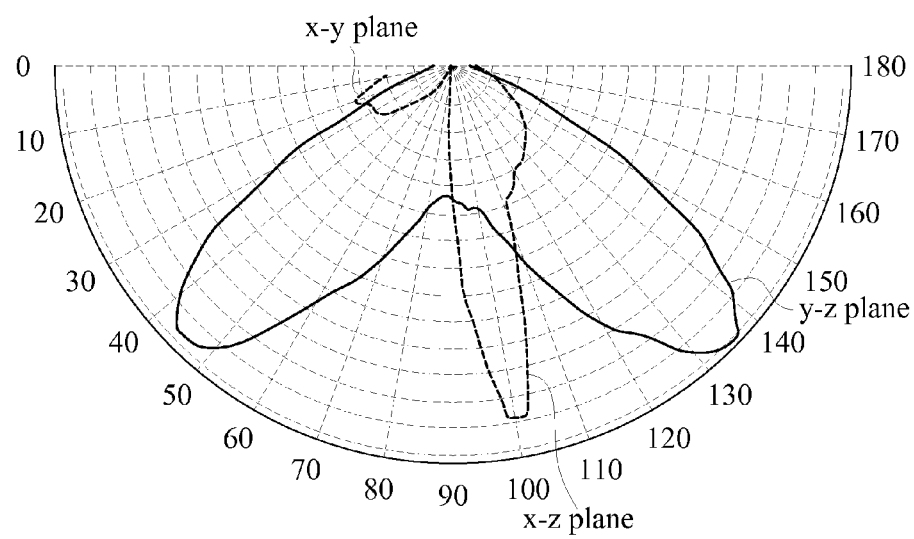
FIG. 11A is a schematic view of a light distribution curve of the optical lens when $W'_{x-y}=0.4$ according to the disclosure.
Figure 11B:
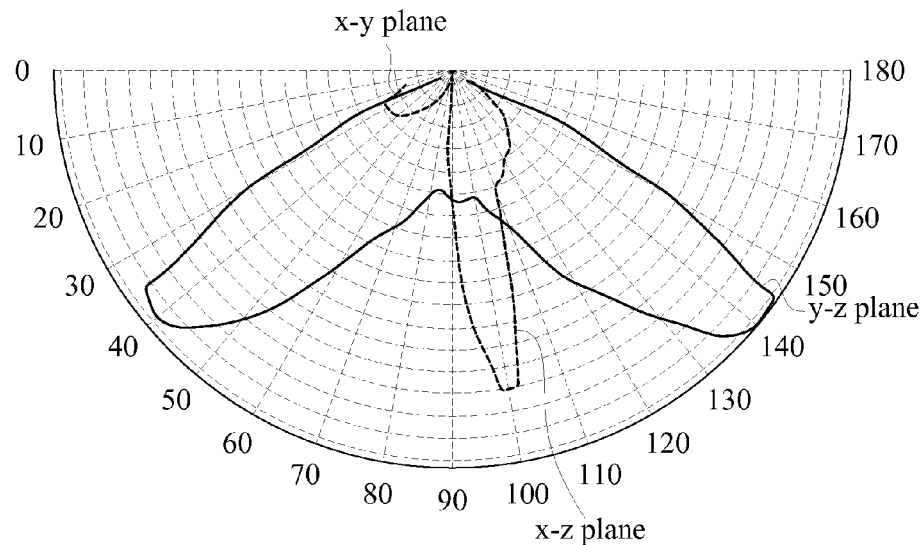
FIG. 11B is a schematic view of a light distribution curve of the optical lens when $W'_{x-y}=0.6$ according to the disclosure.
Figure 11C:
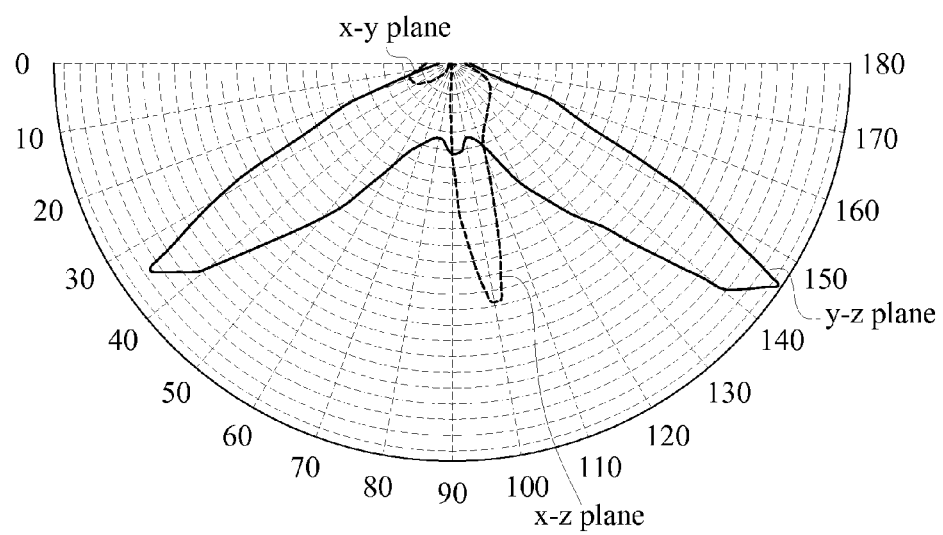
FIG. 11C is a schematic view of a light distribution curve of the optical lens when $W'_{x-y}=1.0$ according to the disclosure.
Figure 11D:
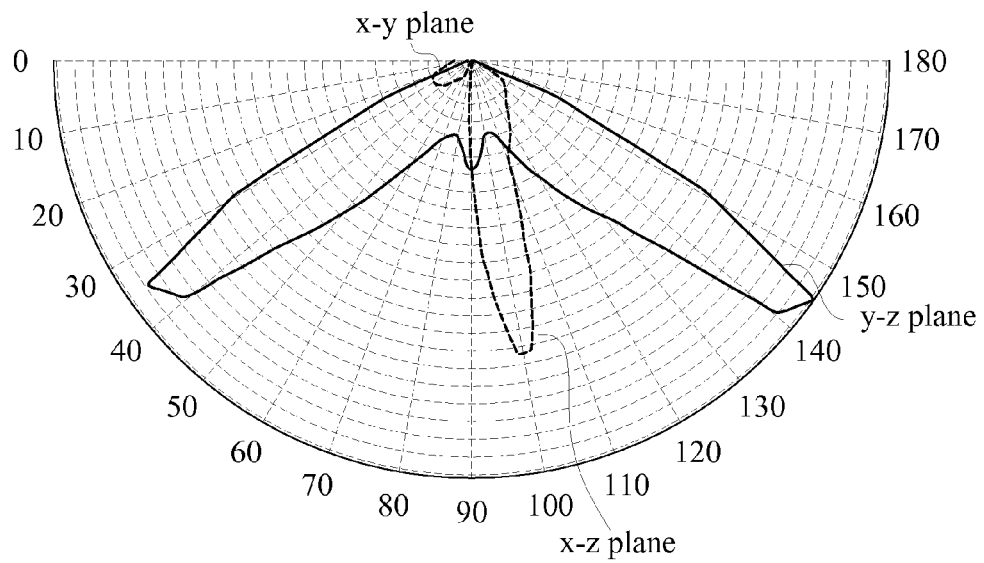
FIG. 11D is a schematic view of a light distribution curve of the optical lens when $W'_{x-y}=1.5$ according to the disclosure.
Figure 11E:
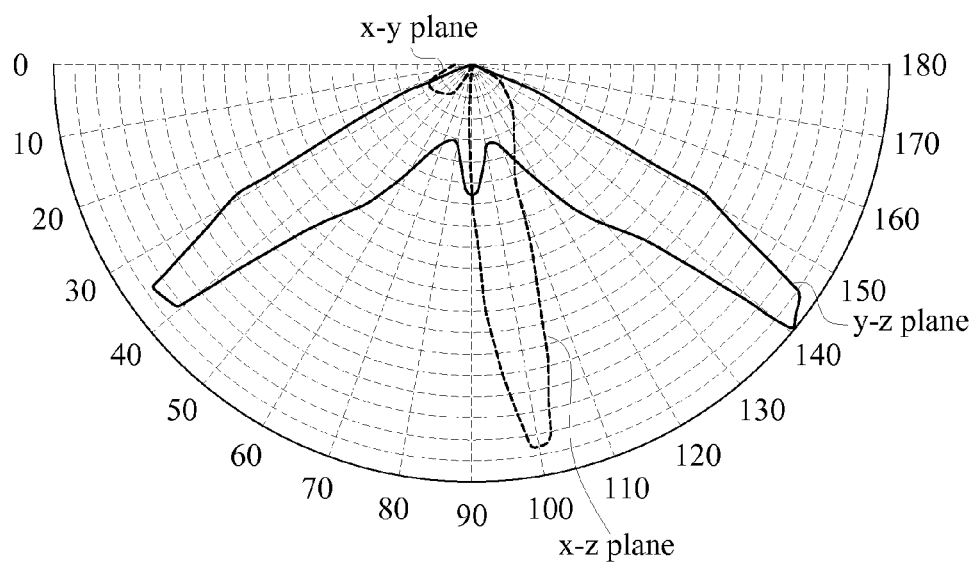
FIG. 11E is a schematic view of a light distribution curve of the optical lens when $W'_{x-y}=2.5$ according to the disclosure.
Figure 12A:
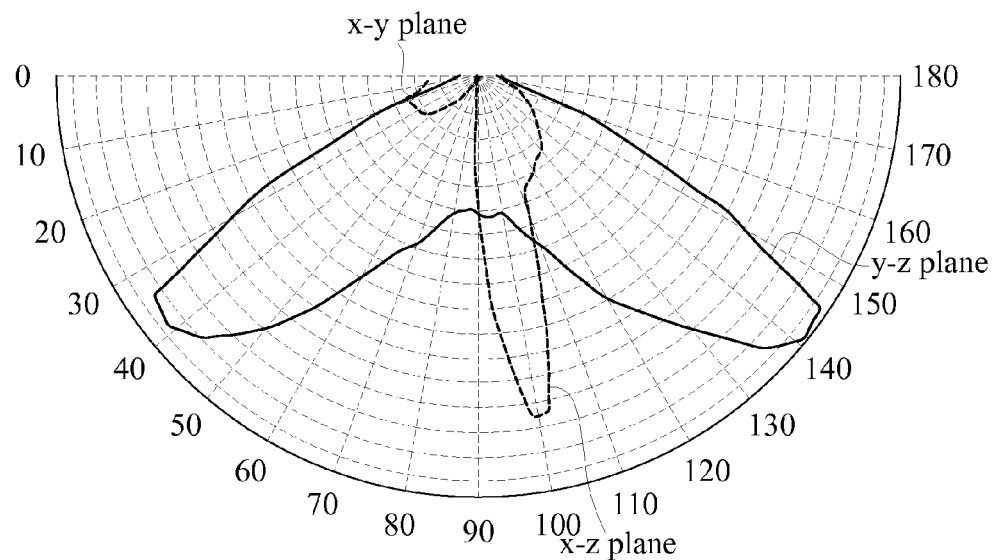
FIG. 12A is a schematic view of a light distribution curve of the optical lens when $-W_{y-z}=0.2$ according to the disclosure.
Figure 12B:
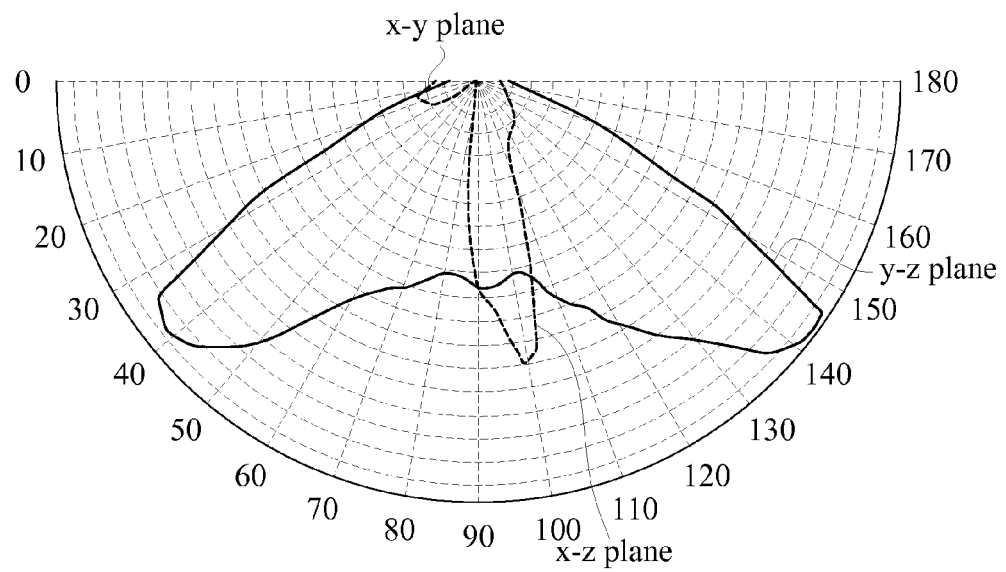
FIG. 12B is a schematic view of a light distribution curve of the optical lens when $-W_{y-z}=0.6$ according to the disclosure.
Figure 12C:
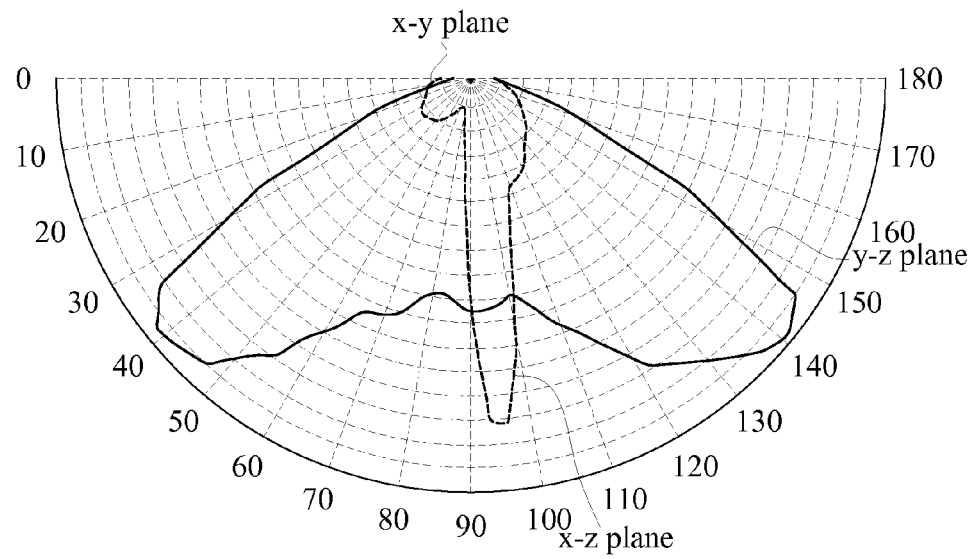
FIG. 12C is a schematic view of a light distribution curve of the optical lens when $W_{y-z}=1$ according to the disclosure.
Figure 12D:
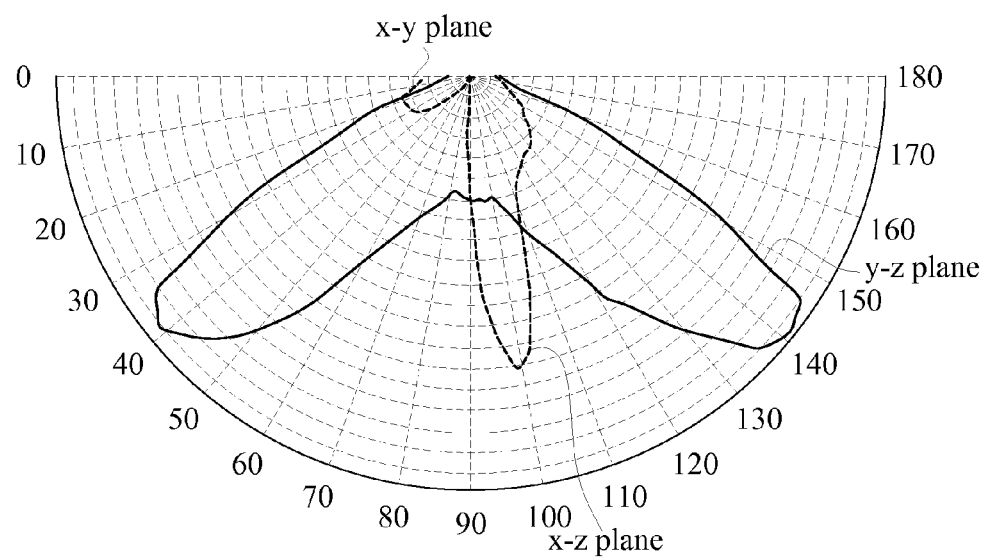
FIG. 12D is a schematic view of a light distribution curve of the optical lens when $W_{y-z}=40$ according to the disclosure.
Figure 12E:
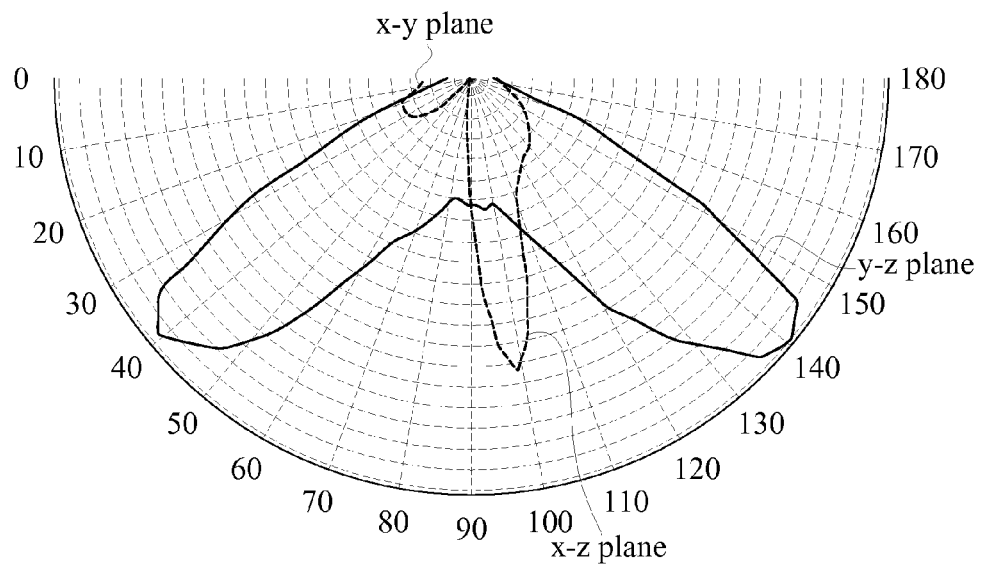
FIG. 12E is a schematic view of a light distribution curve of the optical lens when $W_{y-z}=100$ according to the disclosure.
Figure 13A:
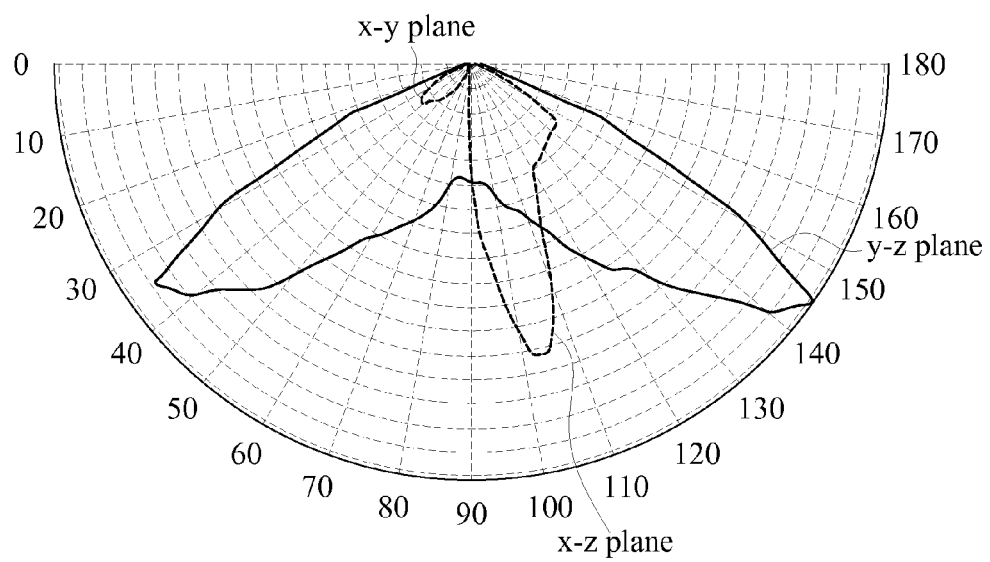
FIG. 13A is a schematic view of a light distribution curve of the optical lens when $W'_{y-z}=0.8$ according to the disclosure.
Figure 13B:
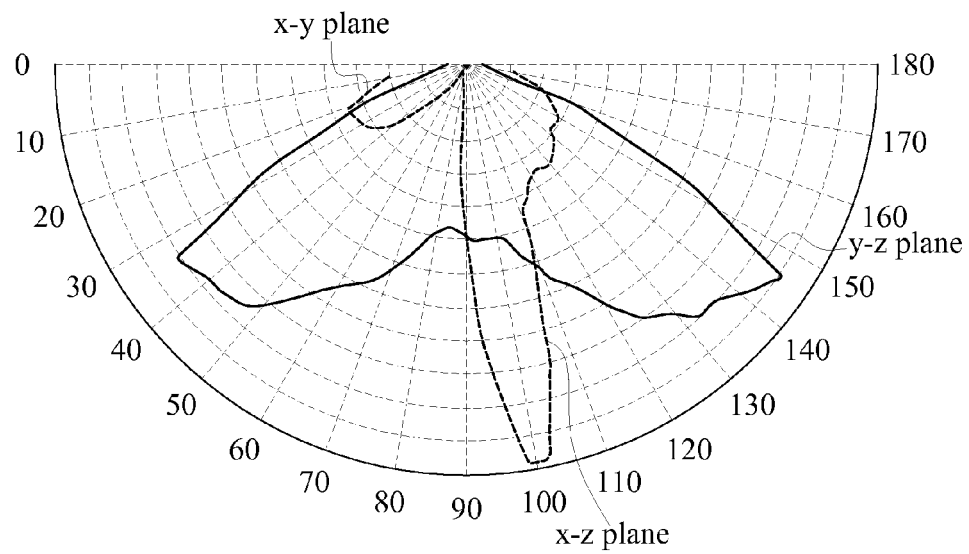
FIG. 13B is a schematic view of a light distribution curve of the optical lens when $W'_{y-z}=1.6$ according to the disclosure.
Figure 13C:
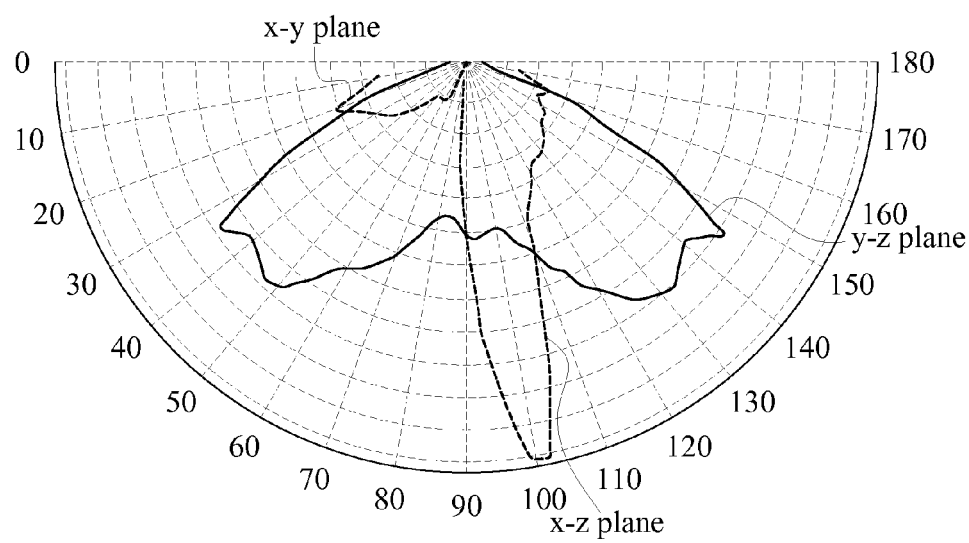
FIG. 13C is a schematic view of a light distribution curve of the optical lens when $W'_{y-z}=2.0$ according to the disclosure.
Figure 13D:
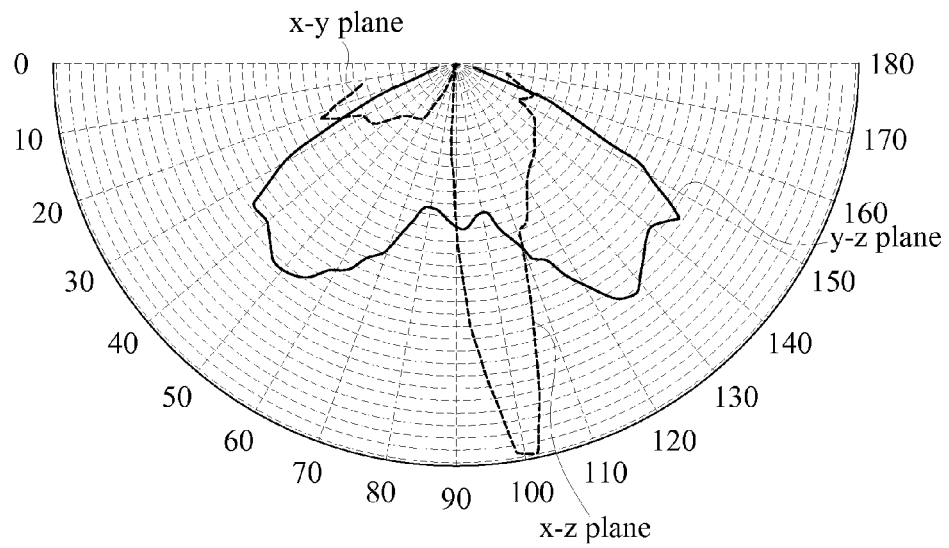
FIG. 13D is a schematic view of a light distribution curve of the optical lens when $W'_{y-z}=2.5$ according to the disclosure.
Figure 13E:
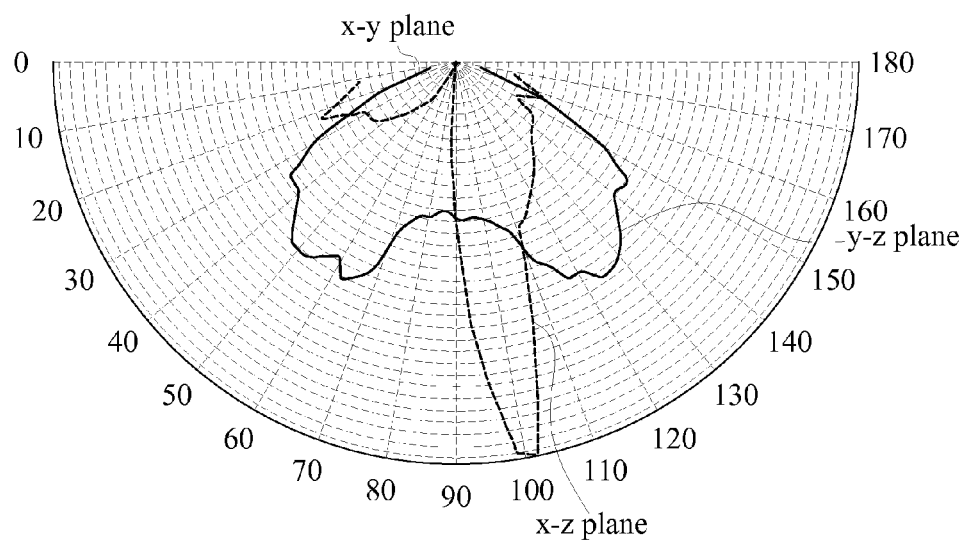
FIG. 13E is a schematic view of a light distribution curve of the optical lens when $W'_{y-z}=3.5$ according to the disclosure.

FIG. 11A to FIG. 11C are respectively schematic views of light distribution curves of an optical lens when $W'_{x-y}=0.4$, 0.6, 1.0, 1.5 and 2.5 according to the disclosure. Referring to FIG. 11A to FIG. 11C, since the optical lens 300 is applicable to the street lamp, an illumination angle and brightness distribution need to be considered to avoid inconvenient use of the optical lens 300 due to a partial dark area. It can be known from FIG. 11A to FIG. 11C that when $0 \leq W'_{x-y} \leq 1$, the light ray may be evenly distributed. In this embodiment, $W'_{x-y}$ of the optical lens 300 is equal to 0.53 (referring to FIG. 9D, it is a schematic view of a light distribution curve of the optical lens when $W'_{x-y}=0.53$ according to the disclosure).

In addition, the first curved surface 302 may satisfy condition expressions (3) and (4) in the following, and the second curved surface 304 may satisfy a condition expression (5) in the following:

$$0.1 < -W_{y-z} < 0.3 \quad (3)$$

$$0 < W_{y-z} < 100 \quad (4)$$

$$0.5 \leq W'_{y-z} \leq 2 \quad (5)$$

in which, $-W_{y-z}$ is the fourth weight factor of the first curved surface 302 in the second plane (y-z plane) in the negative y axis direction (y<0), $W_{y-z}$ is the third weight factor of the first curved surface 302 in the second plane (y-z plane) on the positive y axis direction (y>0), and $W'_{y-z}$ is the seventh weight factor of the second curved surface 304 in the second plane (y-z plane) in the positive y axis direction (y>0).

Referring to FIG. 12A to FIG. 12E and FIG. 13A to FIG. 13E, FIG. 12A to FIG. 12E are respectively schematic views of light distribution curves of an optical lens when $-W_{y-z}=0.2$ and 0.6, and $W_{y-z}=1$, 40, and 100, and FIG. 13A to FIG. 13E are respectively schematic views of light distribution curves of an optical lens when $W'_{y-z}=0.8$, 1.6, 2.0, 2.5 and 3.5 according to the disclosure. It can be known from FIG. 12A to FIG. 12E and FIG. 13A to FIG. 13E that, when the optical lens 300 conforms to the condition expressions (3), (4) and (5), the illumination angle and the brightness distribution are applicable to the street lamp.

Figure 14A:
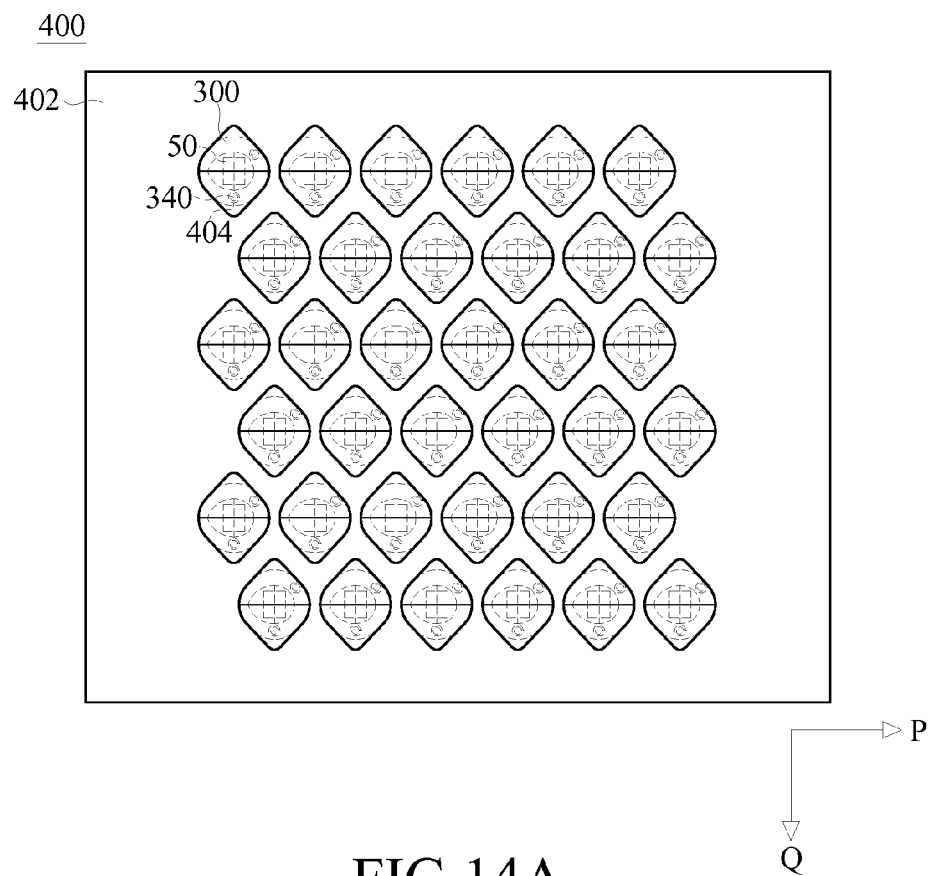
FIG. 14A is a schematic structure top view of an embodiment of the optical lens applied to an optical lens module according to FIG. 9A.

FIG. 14A is a schematic structure top view of an embodiment of the optical lens applied to an optical lens module according to FIG. 9A. Referring to FIG. 14A, the optical lens module 400 is applicable to a lamp (not shown), and the lamp has multiple light sources 50, in which the light source 50 may be an LED, but is not limited to the above-mentioned light source. The number of the light sources 50 may be 36, but is not limited to the above-mentioned number, and an arrangement manner of the light source 50 may be a 6×6 array, but is not limited to the above-mentioned arrangement manner, in which an interval in P direction may be 12 millimeters (mm), but is not limited to the above-mentioned distance, an interval in Q direction may be 12 mm, but is not limited to the above-mentioned distance. The number and the arrangement manner of the actual light sources 50 may be adjusted according to the actual requirements. An optical lens module 400 includes a substrate 402 and 36 optical lenses 300, in which each of the optical lenses 300 is disposed on the substrate 402, and each of the optical lenses 300 corresponds to each of the light sources 50. The substrate 402 has multiple holes 404, each of the optical lenses 300 includes two snapping portions 340, and each of the optical lenses 300 is disposed on the substrate 402 after the two snapping portions 340 are buckled with the holes 40 respectively.

In this embodiment, the type of the optical lens included by the optical lens module 400 is only one (that is, the optical lens 300), but this embodiment is not intended to limit the disclosure, and the type of the optical lens included by the optical lens module 400 may be assembled and arranged according to the requirements of the user.

Figure 14B:
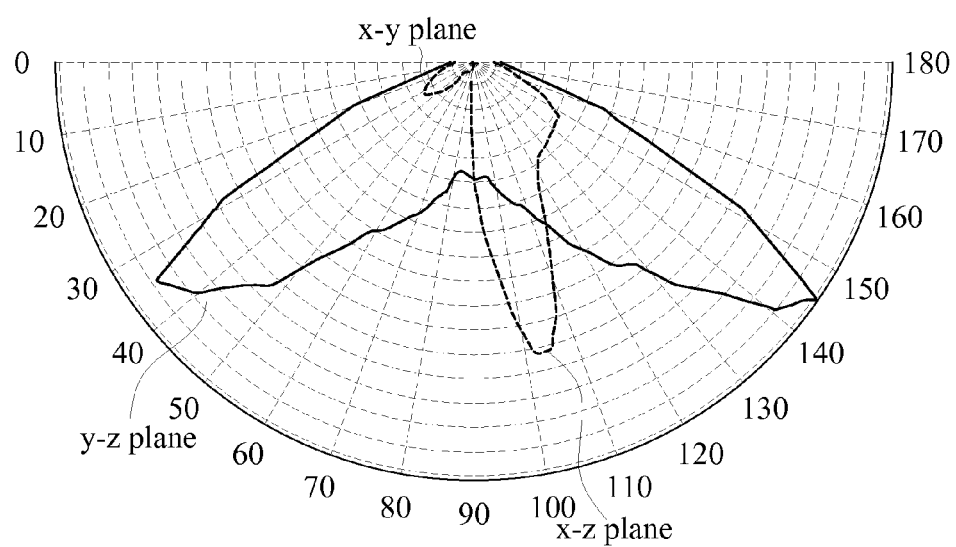
FIG. 14B is a schematic view of the light distribution curve according to FIG. 14A.

FIG. 14B is a schematic view of the light distribution curve according to FIG. 14A. Referring to FIG. 14B, maximum light intensity in Q direction occurs at about 35 degrees and 145 degrees, and minimum light intensity occurs at about 85 degrees, in which a proportion of the maximum light intensity and the minimum light intensity is 1:3.2. The light shape in P direction is asymmetrically designed, so that most of the light ray may directly irradiate on an irradiation surface (not shown).

Figure 15:
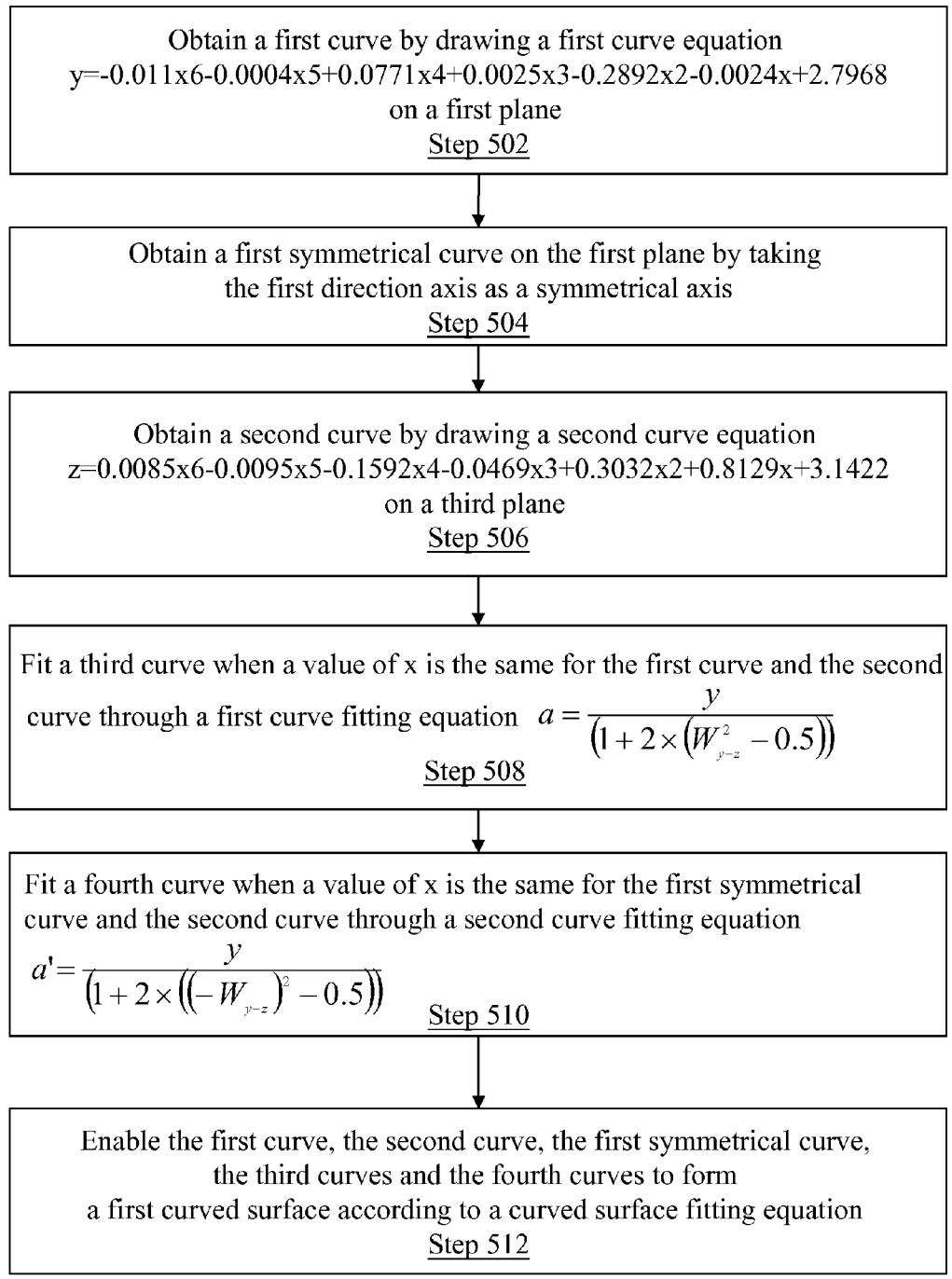
FIG. 15 is a schematic flow chart of another embodiment of a method for forming a curved surface of an optical lens according to the disclosure.

FIG. 15 is a schematic flow chart of another embodiment of a method for forming a curved surface of an optical lens according to the disclosure. Referring to FIG. 15, in this embodiment, the method for forming the curved surface of the optical lens includes the following steps.

In Step 502, a first curve is obtained on a first plane according to a first curve equation $y=-0.011x^6-0.0004x^5+0.0771x^4+0.0025x^3-0.2892x^2-0.0024x+2.7968$, in which x is a parameter on a first direction axis, y is a parameter on a second direction axis, and the first plane is a plane formed by the first direction axis and the second direction axis.

In Step 504, a first symmetrical curve is obtained on the first plane by taking the first direction axis as a symmetrical axis.

In Step 506, a second curve is obtained on a third plane according to a second curve equation $z=0.0085x^6-0.0095x^5-0.1592x^4-0.0469x^3+0.3032x^2+0.8129x+3.1422$, in which z is a parameter on a third direction axis, the third plane is a plane formed by the first direction axis and the third direction axis, the first plane is perpendicular to the third plane, and the first direction axis, the second direction axis, and the third direction axis intersect at an origin.

In Step 508, a third curve is fit when a value of x is the same for the first curve and the second curve through a first curve fitting equation $$a = \frac{y}{(1 + 2 \times (W_{y-z}^2 - 0.5))},$$

in which $W_{y-z}$ is a first weight factor of each of the third curves, and a distance a is a distance from an intersection point of a tangent of any point on each third of the curves and the second direction axis to the origin.

In Step 510, a fourth curve is fit when a value of x is the same for the first symmetrical curve and the second curve through a second curve fitting equation $$a' = \frac{y}{(1 + 2 \times ((-W_{y-z})^2 - 0.5))},$$

in which $-W_{y-z}$ is a second weight factor of each fourth curve, and a distance a' is another distance from an intersection point of a tangent of any point on each of the fourth curves and the second direction axis to the origin.

In Step 512, the first curve, the second curve, the first symmetrical curve, the multiple third curves and the multiple fourth curves are enabled to form a first curved surface by using a curved surface fitting equation.

Figure 16A:
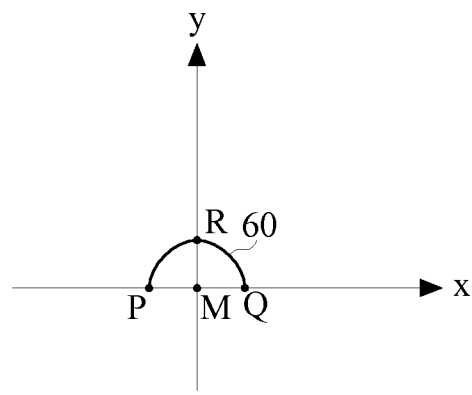
FIG. 16A is a schematic view of a first curve equation on a first plane according to Step 502 in FIG. 15.

FIG. 16A is a schematic view of a first curve equation on a first plane according to Step 502 in FIG. 15. Referring to FIG. 16A, in this embodiment, the first direction axis may be x axis, but is not limited to the above-mentioned axis, the second direction axis may be y axis, but is not limited to the above-mentioned axis, and the first plane may be x-y plane, but is not limited to the above-mentioned plane. The setting of the first direction axis and the second direction axis may be adjusted according to the actual requirements. When the first curve equation is drawn on x-y plane (the first plane), the first curve equation is intersected with x axis at a point P and a point Q, and the first curve equation is intersected with y axis at a point R. A first curve 60 is a curve from the point P to the point Q through the point R in FIG. 16A.

Figure 16B:
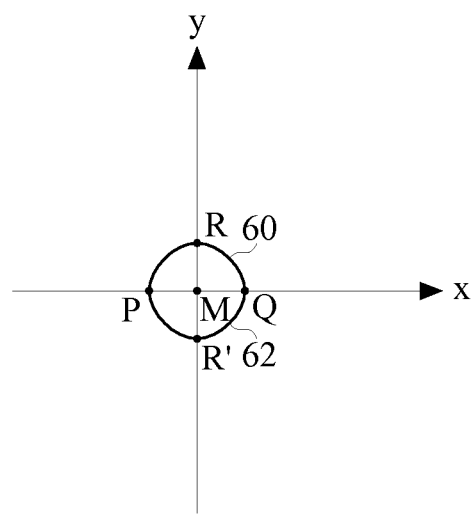
FIG. 16B is a schematic view of a first curve and a first symmetrical curve according to Step 504 in FIG. 15.

FIG. 16B is a schematic view of a first curve and a first symmetrical curve according to Step 504 in FIG. 15. Referring to FIG. 16B, the first symmetrical curve 62 is symmetrical to the first curve 60 by taking x axis as a symmetrical axis, in which a point R' is symmetrical to the point R.

Figure 16C:
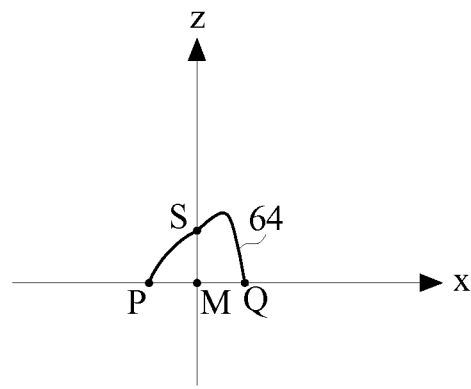
FIG. 16C is a schematic view of a second curve equation on a third plane according to Step 506 in FIG. 15.

FIG. 16C is a schematic view of a second curve equation on a third plane according to Step 506 in FIG. 15. Referring to FIG. 16C, in this embodiment, the third direction axis may be z axis, but is not limited to the above-mentioned axis, and the third plane may be, x-z plane, but is not limited to the above-mentioned plane. When the second curve equation is drawn on x-z plane (the third plane), the second curve equation is intersected with x axis at a point P and a point Q, and the second curve equation is intersected with z axis at a point S. A second curve 64 is a curve from the point P to the point Q through the point S in FIG. 16C. In addition, the first direction axis (x axis), the second direction axis (y axis) and the third direction axis (z axis) intersect at an origin M.

Figure 16D:
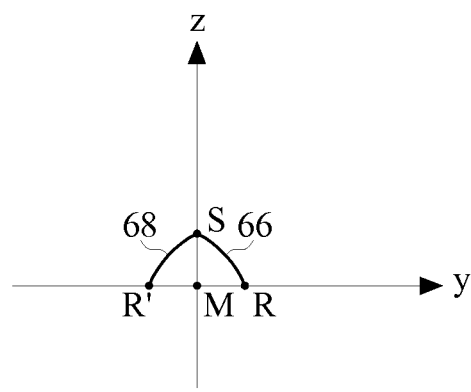
FIG. 16D is a schematic view of a third curve and a fourth curve on a second plane according to Step 508 in FIG. 15.

FIG. 16D is a schematic view of a third curve and a fourth curve on a second plane according to Step 508 in FIG. 15. Referring to FIG. 16D, the number of the third curves 66 and the fourth curves 68 obtained through Step 508 to Step 510 may be determined by controlling the number of x values. In order to simplify the figure, the third curve 66 and the fourth curve 68 when x=0 (that is, the second plane) are merely drawn in FIG. 16D.

In the Step 508, the first weight factor $W_{y-z}$ in the first curve fitting equation is used for controlling the third curve 66 when the value of x is the same for the first curve 60 and the second curve 64, in which, $0.1 \leq W_{y-z} \leq 4.5$, and a distance a is a distance from an intersection point of a tangent of any point on each of the third curves 66 and the second direction axis (y axis) to the origin M. In the Step 510, the second weight factor $-W_{y-z}$ in the second curve fitting equation is used for controlling the fourth curve 68 when the value of x is the same for the first symmetrical curve 62 and the second curve 64, in which, $0.1 \leq -W_{y-z} \leq 4.5$, and a distance a' is another distance from an intersection point of a tangent of any point on each of the fourth curves 68 and the second direction axis (y axis) to the origin M.

In this embodiment, a method for controlling each third curve 66 and each fourth curve 68 by the first weight factor $W_{y-z}$ and the second weight factor $-W_{y-z}$ is the same as a method for controlling the first curve 202 by the first weight factor $W_{x-y}$ in Step 104, which is not described in detail herein again.

Figure 17A:
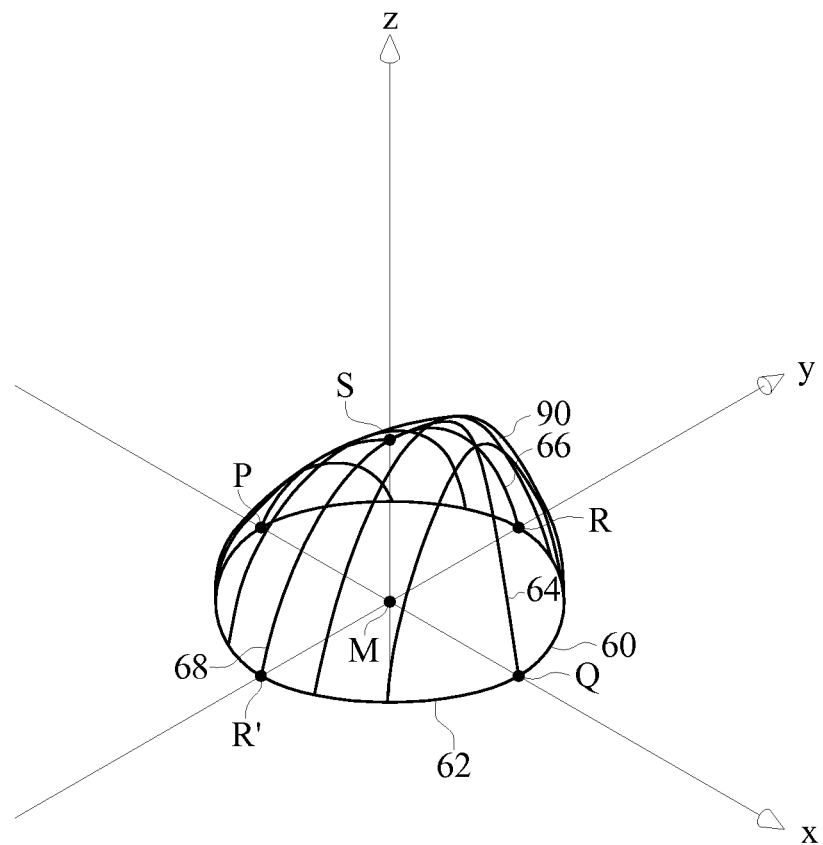
FIG. 17A is a schematic view of a first curved surface according to Step 512 in FIG. 15.

FIG. 17A is a schematic view of a first curved surface according to Step 512 in FIG. 15. Referring to FIG. 17A, in Step 512, the first curve 60, the first symmetrical curve 62, the second curve 64, the multiple third curves 66 and the multiple fourth curves 68 are enabled to form a first curved surface 90 according to the curved surface fitting equation.

Figure 17B:
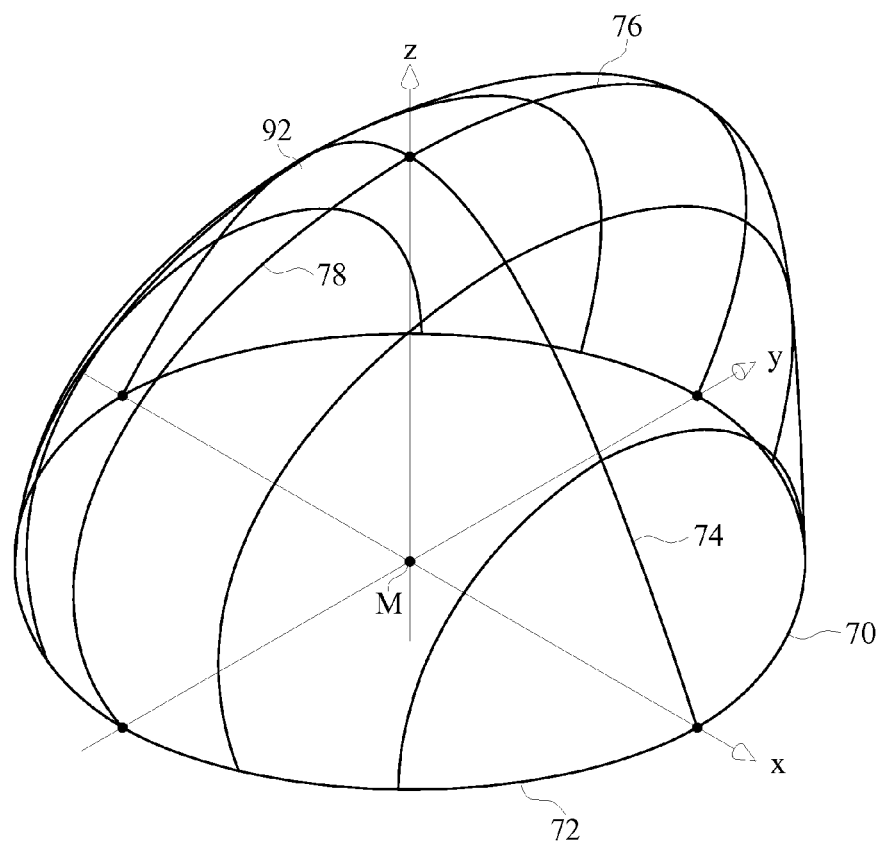
FIG. 17B is a schematic view of a second curved surface according to the disclosure.
Figure 17C:
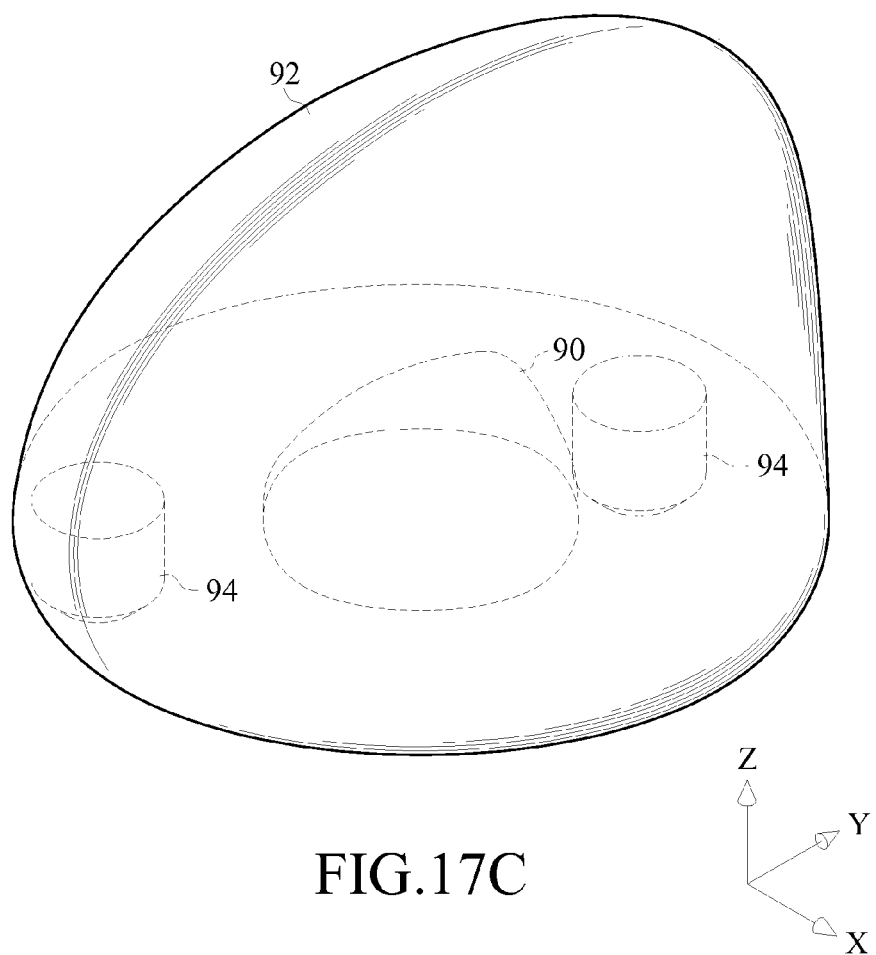
FIG. 17C is a schematic structural perspective view of the optical lens according to FIG. 17A and FIG. 17B.

The first curved surface 90 may be obtained through the above-mentioned method, and a second curved surface 92 may also be obtained through the same method, so that an optical lens 500 may be designed through the above-mentioned method. FIG. 17B and FIG. 17C are respectively a schematic view of a second curved surface according to the disclosure and a schematic structural perspective view of the optical lens according to FIG. 17A and FIG. 17B. Referring to FIG. 17B and FIG. 17C, in this embodiment, the second curved surface 92 is opposite to the first curved surface 90, and the second curved surface 92 includes a fifth curve 70, a fifth symmetrical curve 72 and a sixth curve 74. The fifth curve 70 and the fifth symmetrical curve 72 are disposed on a first plane (x-y plane), and the fifth curve 70 is symmetrical to the fifth symmetrical curve 71 by taking a first direction axis (x axis) as a symmetrical axis. The fifth curve 70 conforms to a third curve equation $y=-0.001x^6+0.0029x^4-0.0002x^3-0.1298x^2-0.0004x+7.0511$. The sixth curve 74 is disposed on a third plane (x-z plane), and the sixth curve 74 conforms to a fourth curve equation $z=0.0003x^4-0.0002x^3-0.0305x^2+0.005x+8.5870$. A seventh curve 76 is obtained through a third curve fitting equation $$b = \frac{y}{(1+2\times(W'^2_{y-z}-0.5))}$$

when the value of x is the same for the fifth curve 70 and the sixth curve 74, in which, $W'_{y-z}$ is a third weight factor of each of the seventh curves 76, $0 \leq W'_{y-z} \leq 1$, and a distance b is a distance from an intersection point of a tangent of any point on each of the seventh curves 76 and the second direction axis (y axis) to an origin M.

An eighth curve 78 is obtained according to a fourth curve fitting equation $$b' = \frac{y}{(1+2\times((-W'_{y-z})^2-0.5))}$$

when the value of x is the same for the fifth symmetrical curve 72 and the sixth curve 74, in which, $-W'_{y-z}$ is a fourth weight factor of each eighth curve 78, $0 \leq -W'_{y-z} \leq 1$, and a distance b' is another distance from an intersection point of a tangent of any point on each of the eighth curves 78 and the second direction axis (y axis) to an origin M. The fifth curve 70, the fifth symmetrical curve 72, the sixth curve 74, multiple seventh curves 76, and multiple eighth curves 78 form a second curved surface 92.

Figure 17D:
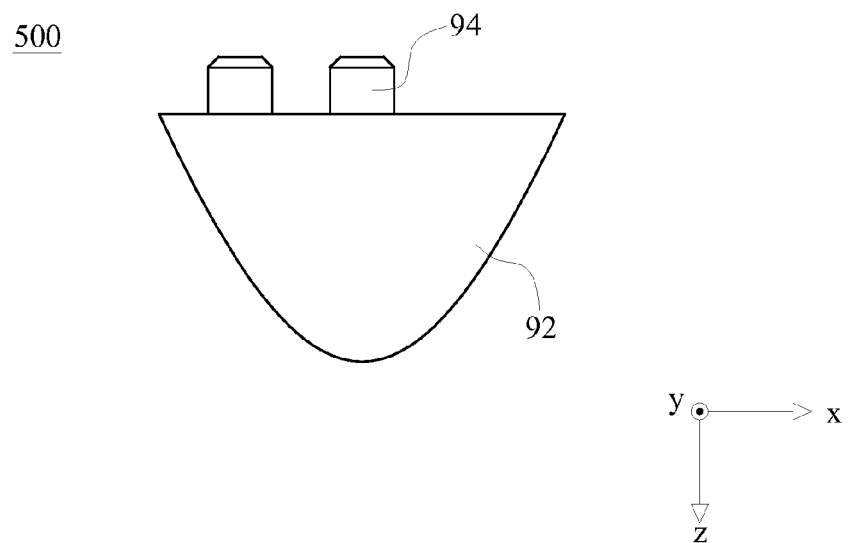
FIG. 17D is a schematic structural side view of an embodiment of the optical lens according to FIG. 17C.
Figure 17E:
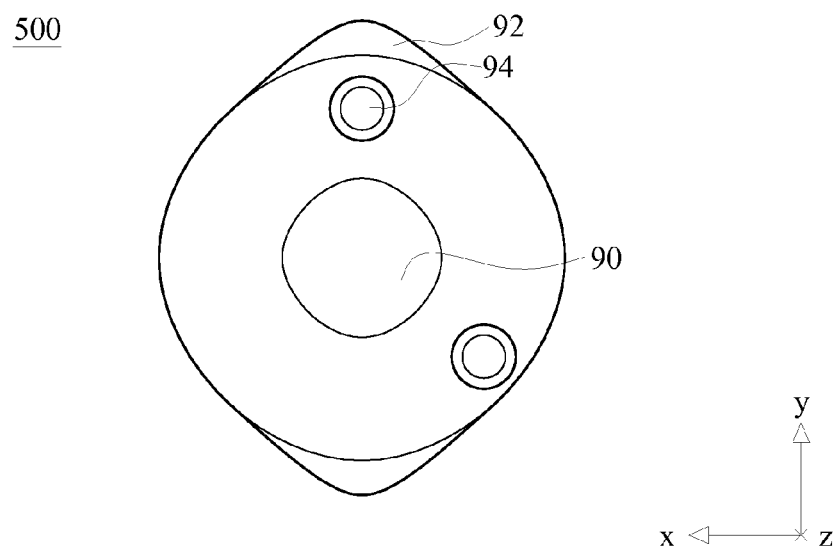
FIG. 17E is a schematic structural bottom view of an embodiment of the optical lens according to FIG. 17C.
Figure 18:
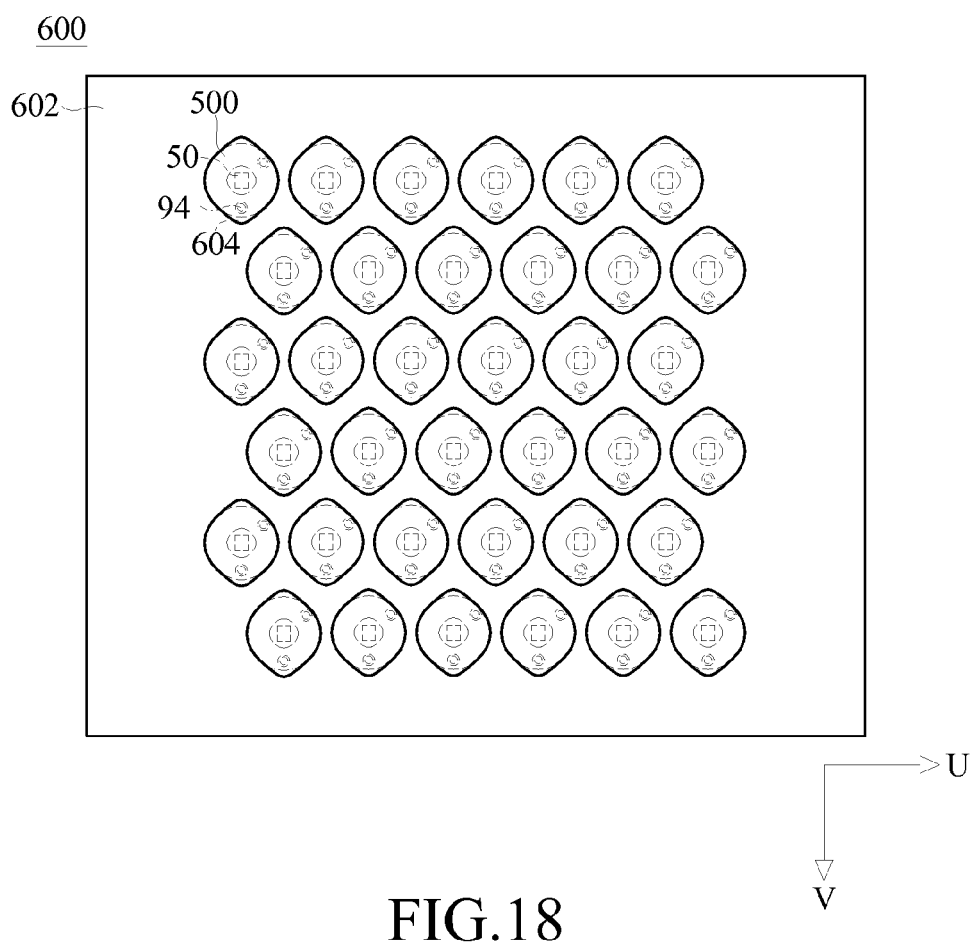
FIG. 18 is a schematic structure top view of an embodiment of the optical lens applied to an optical lens module according to FIG. 17E.

Therefore, various optical lenses with different specification requirements may be designed by setting different weight factors. In addition, FIG. 17D and FIG. 17E are respectively schematic structure side and bottom views of an embodiment of an optical lens according to FIG. 17C. Referring to FIG. 17D and FIG. 17E, in this embodiment, an optical lens 500 includes two snapping portions 94, and the optical lens 500 may be buckled with a substrate 602 through the two snapping portions 94 to form an optical lens module 600 (referring to FIG. 18, it is a schematic structural top view of an embodiment of the optical lens applied to an optical lens module according to FIG. 17E).

Specifically, the optical lens module 600 is applicable to a lamp (not shown), and the lamp has multiple light sources 50, in which the light source 50 may be an LED, but is not limited to the above-mentioned light source. The number of the light sources 50 may be 36, but is not limited to the above-mentioned number, and an arrangement manner of the light source 50 may be an array, but is not limited to the above-mentioned arrangement manner, in which the number of the light sources 50 at each row (U direction) and that at each column (V direction) are both 6. The number and the arrangement manner of the actual light sources 50 may be adjusted according to the actual requirements. An optical lens module 600 may include, a substrate 602 and 36 optical lenses 500, but is not limited to the above mentioned, each of the optical lenses 500 is disposed on the substrate 602, and each of the optical lenses 500 corresponds to each of the light sources 50. The number of the actual optical lenses 500 may be adjusted according to the actual requirements. The substrate 602 has multiple holes 604, and each of the optical lenses 500 is disposed on the substrate 602 after the two snapping portions 94 are buckled with the holes 604.

In this embodiment, the type of the optical lens included by the optical lens module 600 is only one (that is, the optical lens 500), but this embodiment is not intended to limit the disclosure, and the type of the optical lens included by the optical lens module 600 may be assembled and arranged according to the requirements of the user.

According to the method for forming the curved surface of the optical lens of the disclosure, optical lenses with different light shapes may be designed. The optical lens with different light shapes used as a minimum unit may be assembled into an optical lens module required by the user through a permutation and combination manner to reduce the research and development cost of various lamps.

What is claimed is:
1. An optical lens, comprising:
a first curved surface, for receiving a light ray, and comprising a first curve, a first symmetrical curve, and a second curve, wherein the first curve and the first symmetrical curve are disposed on a first plane, the first curve is symmetrical to the first symmetrical curve by taking a first direction axis as a symmetrical axis, the second curve is disposed on a third plane, the first plane is perpendicular to the third plane, the first curve conforms to a first curve equation $y=-0.011x^6-0.0004x^5+0.0771x^4+0.0025x^3-0.2892x^2-0.0024x+2.7968$, the second curve conforms to a second curve equation $z=0.0085x^6-0.0095x^5-0.1592x^4-0.0469x^3+0.3032x^2+0.8129x+3.1422$, when a value of x is the same for the first curve and the second curve, a third curve is obtained according to a first curve fitting equation

$$a = \frac{y}{(1+2\times(W_{y-z}^2-0.5))},$$

when a value of x is the same for the first symmetrical curve and the second curve, a fourth curve is obtained according to a second curve fitting equation $$a' = \frac{y}{(1+2\times((-W_{y-z})^2-0.5))},$$

the first curve, the second curve, the first symmetrical curve, the third curves and the fourth curves form first curved surface, wherein x is a parameter on a third direction axis, the first plane is a plane formed by the first direction axis and the second direction axis, the third plane is a plane formed by the first direction axis, and the third direction axis, the first direction axis, the second direction axis, and the third direction axis intersect at an origin, $W_{y-z}$ is a first weight factor of each to the third curves, and $-W_{y-z}$ is a second weight factor of each of the fourth curves, a distance a is a distance from an intersection point of a tangent of any point on each of the third curves and the second direction axis to the origin, and distance a' is another distance from an intersection point of a tangent of any point on each fourth curve and the second direction axis to the origin; and a second curve surface, opposite to the first curved surface, and comprising a fifth curve, a fifth symmetrical curve and a sixth curve, wherein the fifth curve and the fifth symmetrical curve are disposed on the first plane, the fifth curve is symmetrical to the fifth symmetrical curve by taking the first direction axis as a symmetrical axis, the sixth curve is disposed on the third plane, the fifth curve conforms to a third curve equation y=−0.001x6+0.0029x4−0.0002x3−0.1298x2−0.0004x+7.0511, the sixth curve conforms to a fourth curve equation z=0.0003x4−0.0002x3−0.0305x2+0.005x+8.5870, when a value of x is the same for the fifth curve and the sixth curve, a seventh curve is obtained according to a third curve fitting equation $$b = \frac{y}{(1+2\times(W_{y-z}'^2-0.5))},$$

when a value of x is the same for the fifth symmetrical curve and the sixth curve, an eighth curve is obtained according to a fourth curve fitting equation $$b' = \frac{y}{(1+2\times((-W_{y-z}')^2-0.5))},$$

the fifth curve, the fifth symmetrical curve, the sixth curve, the seventh curves, and the eighth curves form the second curved surface, $W'_{y-z}$ is a third weight factor of each of the seventh curves, and $-W'_{y-z}$ is a fourth weight factor of each eighth of the curves, a distance b is a distance from an intersection point of a tangent of any point on each of the seventh curves and the second direction axis to the origin, and a distance b' is another distance from an intersection point of a tangent of any point on each of the eighth curves and the second direction axis has to the origin.

2. An optical lens module, applicable to a lamp, wherein the lamp has a plurality of light sources, the optical lens module comprising:

a substrate; and a plurality of optical lenses, disposed on the substrate, wherein each of the optical lenses corresponds to each of the light sources, and each of the optical lenses comprises:

a first curved surface, for receiving a light ray, and comprising a first curve, a first symmetrical curve, and a second curve, wherein the first curve and the first symmetrical curve are disposed on a first plane, the first curve is symmetrical to the first symmetrical curve by taking a first direction axis as a symmetrical axis, the second curve is disposed on a third plane, the first plane is perpendicular to the third plane, the first curve conforms to a first curve equation y=−0.011x6−0.0004x5+0.0771x4+0.0025x3−0.2892x2−0.0024x+2.7968, the second curve conforms to a second curve equation z=0.0085x6−0.0095x5−0.1592x4−0.0469x3+0.3032x2+0.8129x+3.1422, when a value of x is the same for the first curve and the second curve, a third curve is obtained according to a first curve fitting equation $$a = \frac{y}{(1+2\times(W_{y-z}^2-0.5))},$$

when a value of x is the same for the first symmetrical curve and the second curve, a fourth curve is obtained according to a second curve fitting equation $$a' = \frac{y}{(1+2\times((-W_{y-z})^2-0.5))},$$

the first curve, the second curve, the first symmetrical curve, the third curves and the fourth curve form the first covered surface, wherein x is a parameter on the first direction axis, z is a parameter on a second direction axis, z is a parameter on a third direction axis, the first plane is a plane formed by the first direction axis and the second direction axis, the third plane is a plane formed by the first direction axis and the third direction axis, the first direction axis, the second direction axis, and the third direction axis intersect at an origin, $W'_{y-z}$ is a first weight factor of each of the third curves, and $-W'_{y-z}$ is a second weight factor of each of the fourth curves, a distance a is a distance from an intersection point of a tangent of any point on each of the third curves and the second direction axis to the origin, and a distance a' is a distance from an intersection point of a tangent of any point on each of the fourth curves and the second direction axis has to the origin; and a second curved surface, opposite to the first curved surface, and comprising a fifth curve, a fifth symmetrical curve and a sixth curve, wherein the fifth curve and the fifth symmetrical curve are disposed on the first plane, the fifth curve is symmetrical to the fifth symmetrical curve by taking the first direction axis as a symmetrical axis, the sixth curve is disposed on the third plane, the fifth curve conforms to a third curve equation y=−0.001x6+0.0029x4−0.0002x3−0.1298x2−0.0004x+7.0511, the sixth curve conforms to a fourth curve equation z=0.0003x4−0.0002x3−0.0305x2+0.005x+8.5870, when a value of x is the same for the fifth curve and the sixth curve, a seventh curve is obtained according to a third curve fitting equation $$b = \frac{y}{(1+2\times(W_{y-z}'^2-0.5))},$$

when the value of x is the same for the fifth symmetrical curve and the sixth curve, an eighth curve is obtained according to a fourth curve fitting equation $$b' = \frac{y}{(1+2\times((-W_{y-z}')^2-0.5))},$$

the fifth curve, the fifth symmetrical curve, the sixth curve, the seventh curves, and the eighth curves form the second curved surface, $W'_{y-z}$ is a third weight factor of each of the seventh curves, and $-W'_{y-z}$ is a fourth weight factor of each of the eighth curves, a distance b is a distance from an intersection point of a tangent of any point on each of the seventh curves and the second direction axis to the origin and a distance b' is another distance from an intersection point of a tangent of any point on each of the eighth curves and the second direction axis to the origin.

3. The optical lens module according to claim 2, wherein the substrate has a plurality of holes, each of the optical lenses has two snapping portions, and each of the optical lenses is disposed on the substrate after the snapping portions are buckled with the holes.

4. A method for forming a curved surface of an optical lens, comprising:

obtaining a first curve on a first plane according to a first curve equation 10 y=−0.011x6−0.0004x5+0.0771x4+ 0.0025x3−0.2892x2−0.0024x+2.7968, wherein x is a parameter on a first direction axis, y is a parameter on a second direction axis, and the first plane is a plane formed by the first direction axis and the second direction axis;

obtaining a first symmetrical curve on the first plane by taking the first direction axis as a symmetrical axis;

obtaining a second curve on a third plane according to a second curve equation z=0.0085x6−0.0095x5− 0.1592x4−0.0469x3+0.3032x2+0.8129x+3.1422, wherein z is a parameter on a third direction axis, the third plane is a plane formed by the first direction axis and the third direction axis, the first plane is perpendicular to the third plane, and the first direction axis, the second direction axis, and the third direction axis intersect at an origin;

fitting a third curve when a value of x is the same for the first curve and the second curve through a first curve fitting equation $$a = \frac{y}{(1+2\times(W_{y-z}^2-0.5))},$$

wherein $W_{y-z}$ is a first weight factor of each of the third curves, and a distance a is a distance from an intersection point of a tangent of any point of each of the third curves direction axis to the origin;

fitting a fourth curve when the value of x is the same for the first symmetrical curve and the second curve through a second curve fitting equation $$a' = \frac{y}{(1+2\times((-W_{y-z})^2-0.5))},$$

wherein $-W_{y-z}$ is a second factor of each of the fourth curves, and a distance a' is another distance from an intersection point of a tangent of any point on each of the fourth curves and the second direction axis to the origin; and enabling the first curve, the first symmetrical curve, the second curve, the third curves and the fourth curves to form a first curved surface by using a curved surface fitting equation.

* * * * *